United States Patent
Ono et al.

(10) Patent No.: US 10,159,117 B2
(45) Date of Patent: Dec. 18, 2018

(54) INDUCTION HEATING SYSTEM, INDUCTION HEATING METHOD, OUTPUT MONITORING APPARATUS, OUTPUT MONITORING METHOD, AND INDUCTION HEATING APPARATUS

(71) Applicant: NETUREN CO., LTD., Shinagawa-ku, Tokyo (JP)

(72) Inventors: Tetsuya Ono, Tokyo (JP); Masato Sugimoto, Tokyo (JP); Yutaka Kiyosawa, Tokyo (JP); Toshihiro Aiba, Tokyo (JP); Kazutomi Oka, Tokyo (JP); Fumiaki Ikuta, Tokyo (JP); Kazuhiro Kawasaki, Tokyo (JP)

(73) Assignee: NETUREN CO., LTD., Tokyo (JP)

( * ) Notice: Subject to any disclaimer, the term of this patent is extended or adjusted under 35 U.S.C. 154(b) by 905 days.

(21) Appl. No.: 14/401,250

(22) PCT Filed: May 17, 2013

(86) PCT No.: PCT/JP2013/064424
§ 371 (c)(1),
(2) Date: Nov. 14, 2014

(87) PCT Pub. No.: WO2013/172481
PCT Pub. Date: Nov. 21, 2013

(65) Prior Publication Data
US 2015/0237680 A1   Aug. 20, 2015

(30) Foreign Application Priority Data

May 18, 2012 (JP) .................................. 2012-115121
May 18, 2012 (JP) .................................. 2012-115122
May 18, 2012 (JP) .................................. 2012-115123

(51) Int. Cl.
*H05B 6/06* (2006.01)
*G01R 31/40* (2014.01)
*G01R 21/06* (2006.01)

(52) U.S. Cl.
CPC ............... *H05B 6/06* (2013.01); *G01R 21/06* (2013.01); *G01R 31/40* (2013.01)

(58) Field of Classification Search
CPC . H05B 6/06; H05B 6/10; H05B 6/685; H05B 6/065; H05B 6/1245; H05B 6/1272;
(Continued)

(56) References Cited

U.S. PATENT DOCUMENTS

| 3,989,916 A * | 11/1976 | Amagami | ............. H02M 7/523 219/622 |
| 2003/0155349 A1 * | 8/2003 | Matsuo | ..................... H05B 6/06 219/664 |
| 2012/0097663 A1 * | 4/2012 | Ito | ............................ C21D 1/10 219/602 |

FOREIGN PATENT DOCUMENTS

| GB | 912619 | 12/1962 |
| JP | 60-249288 | 12/1985 |

(Continued)

OTHER PUBLICATIONS

International Search Report and Written Opinion for PCT/JP2013/064424, dated Jan. 14, 2014.

*Primary Examiner* — Ibrahime A Abraham
*Assistant Examiner* — Justin Dodson
(74) *Attorney, Agent, or Firm* — Wenderoth, Lind & Ponack, L.L.P.

(57) ABSTRACT

An induction heating system includes induction heating apparatuses, each including a high-frequency current transformer, a low-frequency current transformer and a heating coil, a high-frequency input switch connected to the high-frequency current transformer, a low-frequency input switch connected to the low-frequency current transformer, a first power source to output a high-frequency electric power and a low frequency electric power, a second power source, a first power source output switch connectable to the first power source, a second power source output switch connectable to the second power source, and a switch controller. Each induction heating apparatus includes a heater control- (Continued)

ler to send a signal to the switching controller to turn on one of the first power source output switch and the second power source output switch, to turn off the other, and to switch on or off each of the high-frequency input switch and the low-frequency input switch.

4 Claims, 21 Drawing Sheets

(58) Field of Classification Search
CPC .. H05B 2206/022; G01R 21/06; G01R 31/40; G03G 15/2039; G03G 15/80; H02M 7/523
USPC ....... 219/660–666, 670, 602, 619, 667, 668, 219/672
See application file for complete search history.

(56) References Cited

FOREIGN PATENT DOCUMENTS

| | | |
|---|---|---|
| JP | 11-188744 | 7/1999 |
| JP | 2005-102484 | 4/2005 |
| JP | 2006-344385 | 12/2006 |
| JP | 2009-158394 | 7/2009 |
| JP | 2011-134614 | 7/2011 |
| JP | 2012-57184 | 3/2012 |
| KR | 2011-0131534 | 12/2011 |
| KR | 2011-0134022 | 12/2011 |

* cited by examiner

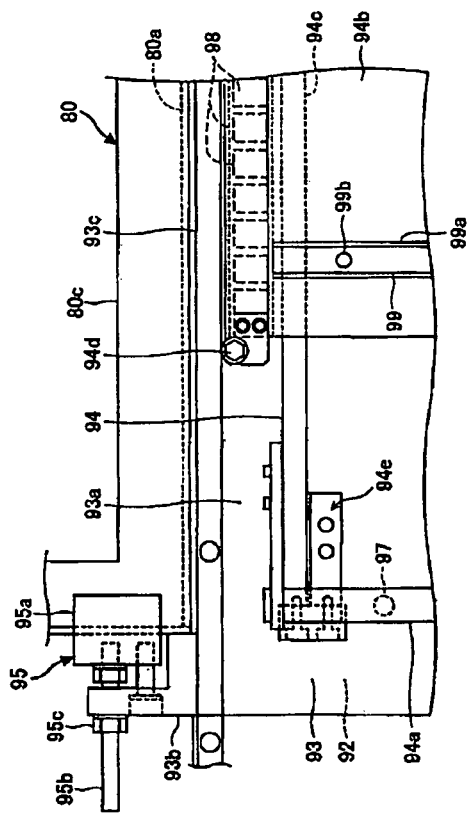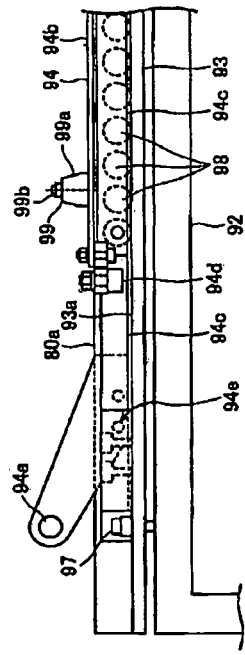
FIG. 8A
FIG. 8B

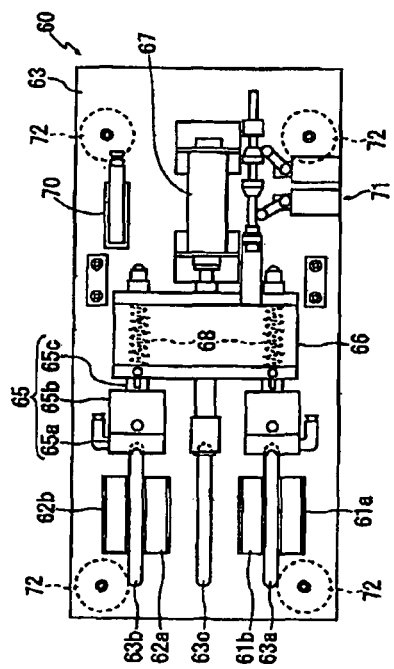
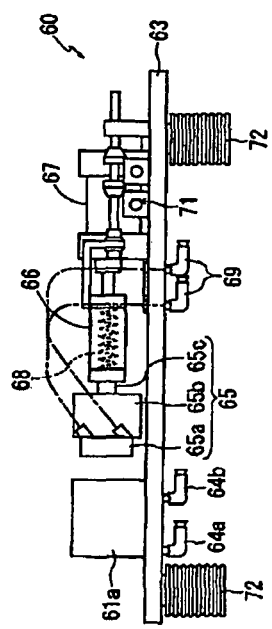
FIG. 12A
FIG. 12B

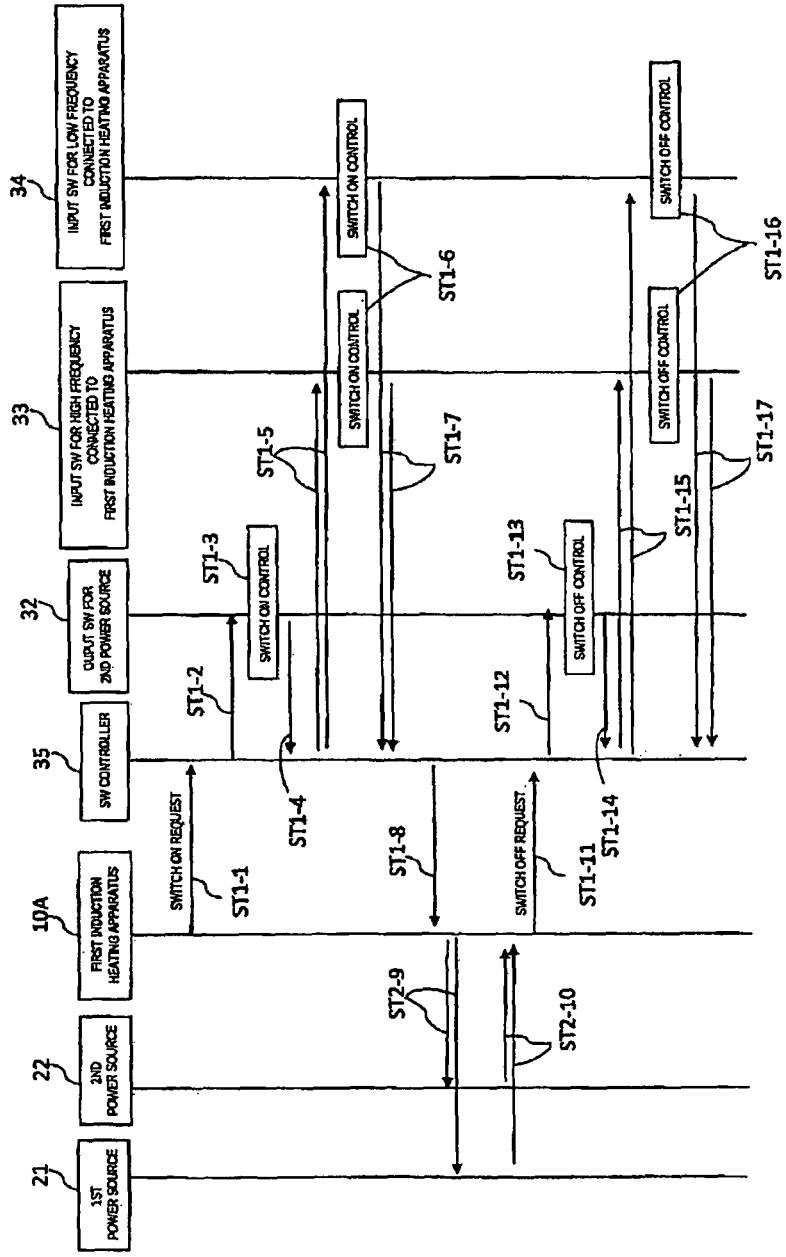

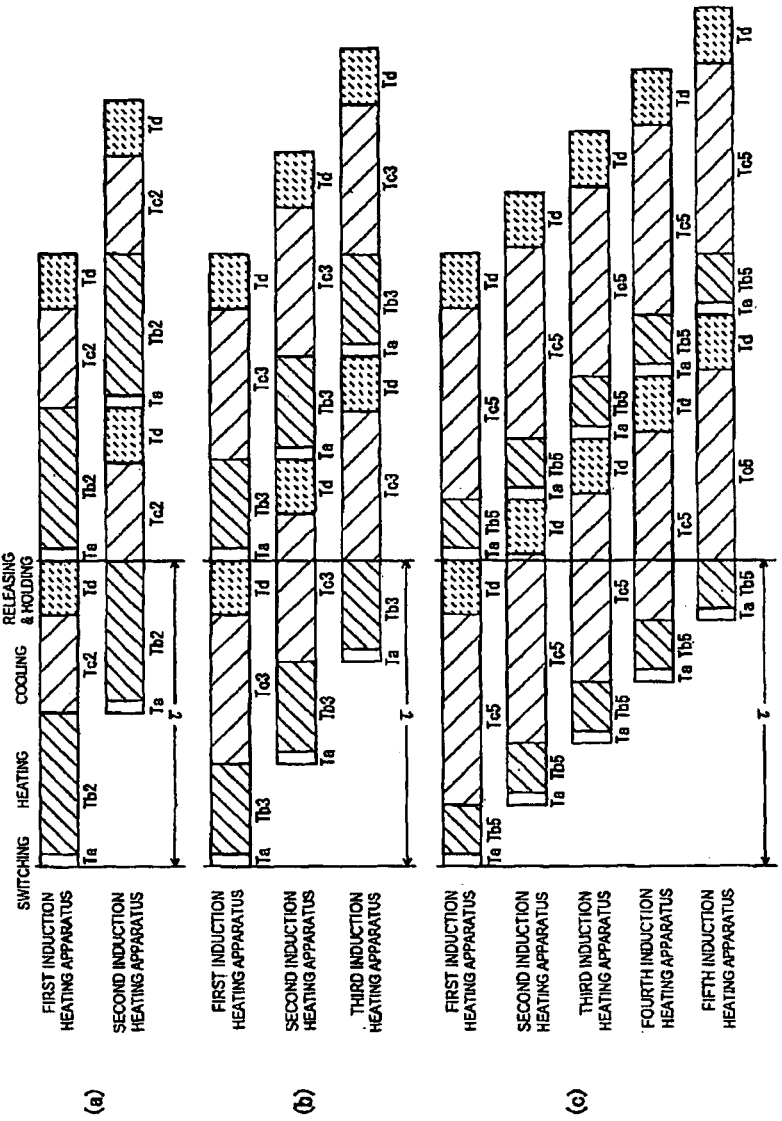

FIG. 16A

| STEP | TIMER | ROTATE | HSW TABLE | HSW2 VR | HSW2 DT | 2BND TABLE | 2BND VR | 2BND FREQ |
|---|---|---|---|---|---|---|---|---|
| 1 | 0 | 0 | 0 | 0 | 0 | 0 | 0 | 3 |
| 2 | 0 | 100 | 0 | 0 | 0 | 0 | 0 | 3 |
| 3 | 0 | 100 | 1 | 0 | 0 | 0 | 0 | 3 |
| 4 | 1 | 100 | 0 | 0 | 0 | 0 | 0 | 3 |
| 5 | 0 | 100 | 2 | 0 | 0 | 0 | 0 | 3 |
| 6 | 10 | 100 | 0 | 0 | 0 | 0 | 0 | 3 |
| 7 | 0 | 100 | 0 | 0 | 0 | 1 | 0 | 3 |
| 8 | 0 | 0 | 0 | 0 | 0 | 0 | 0 | 3 |
| . | | | | | | | | |
| . | | | | | | | | |
| 25 | | | | | | | | |

FIG. 16B

| ROW | VR | DT | HT |
|---|---|---|---|
| 1 | 400 | 100 | 3 |
| 2 | 500 | 0 | 0.5 |
| 3 | | | |
| . | | | |
| . | | | |
| 15 | | | |

FIG. 16C

| ROW | VR | DT | HT |
|---|---|---|---|
| 1 | 800 | 50 | 1 |
| 2 | | | |
| . | | | |
| . | | | |
| 15 | | | |

FIG. 16D

| | HSW2 (FIRST POWER SOURCE) | | | 2BND (SECOND POWER SOURCE) | | |
|---|---|---|---|---|---|---|
| ROW | VR | FRQ | HT | VR | FRQ | HT |
| 1 | 0 | 200 | 0 | 500 | 3 | 20 |
| 2 | 600 | 200 | 5 | 300 | 3 | 5 |
| . | | | | | | |
| . | | | | | | |
| 15 | | | | | | |

FIG. 17

INDUCTION HEATING SYSTEM, INDUCTION HEATING METHOD, OUTPUT MONITORING APPARATUS, OUTPUT MONITORING METHOD, AND INDUCTION HEATING APPARATUS

TECHNICAL FIELD

The present invention relates to an induction heating system and an induction heating method for supplying electric power with different frequencies to a plurality of induction heating apparatuses, an output monitoring apparatus and an output monitoring method for monitoring an output situation when electric power is supplied from a power supply apparatus to a heating coil to perform induction heating, and an induction heating apparatus having a low-frequency current transformer and a high-frequency current transformer.

BACKGROUND ART

In a system according to a first related art, in order to perform induction heating on a workpiece according to the shape of the workpiece or a portion of the workpiece to be heated, or according to disposition of a coil with respect to the workpiece, a workpiece supporting manner, or the like, different types of multiple induction heating apparatuses are disposed. For example, when induction heating is performed, the penetration depth of a magnetic flux, which is generated from a heating coil, from the outer surface of a workpiece into the workpiece depends on a frequency, according to the thickness of a heat treatment layer, a frequency is selected. In order to thicken the heat treatment layer, a low frequency is used, and in order to make the heat treatment layer shallow, a high frequency is used. To this end, there is a system configured by disposing power sources having different output frequencies and connecting the power sources to induction heating apparatuses through switches, respectively, to perform induction heating on workpieces by the different frequencies (see, e.g., JP60-249288A).

Further, recently, induction heating has been performed using a plurality of frequencies, not one frequency. For example, induction heating has been performed by superimposing a low frequency and a high frequency at the same time.

However, if a power supply system for outputting electric power of a plurality of frequencies is disposed with respect to one induction heating apparatus, equipment becomes large in scale, and an induction heating system becomes expensive. Also, in the system disclosed in JP60-249288A, it is impossible to attach heating coils different in shape or size in the induction heating apparatuses, and freely set a time chart of power supply to each heating coil. Further, if it is assumed to make the thickness of the heat treatment layer different for each workpiece or to perform various heat treatments such as quenching and tempering in the individual induction heating apparatuses, since load impedances including workpieces are different with respect to the power supply system, it is necessary to provide a large-scale power supply system or matching circuit, and thus the entire induction heating system becomes large-scale.

In a system according to a second related art, one power supply apparatus is used to supply electric power to a plurality of induction heating apparatuses. This system includes, for example, a high-frequency power source, a current transformer having the primary side connected to the high-frequency power source, and a plurality of induction heating coils connected in parallel to the secondary side of the current transformer (see, e.g., JP2009-158394A). In this system, a voltage detecting sensor is provided on the secondary side of the current transformer, and a current detecting sensor is provided at a position adjacent to the induction heating coils. On the basis of the value of a voltage which the voltage detecting sensor detects, and the value of a current which the current detecting sensor detects, the magnitude of electric power being supplied to the induction heating coils is monitored.

However, when the power supply apparatus outputs electric power by a time-division multiplexing method or a superimposing method, it is impossible to monitor the output situation. Also, in a case where a plurality of power supply apparatuses supplies electric power according to a supply condition requested by each induction heating apparatus, there is no method of confirming whether electric power is being supplied according to the supply condition.

SUMMARY OF INVENTION

An object of the present invention is to provide an induction heating system and method capable of supplying electric power from a single power source system to a plurality of induction heating apparatuses and freely setting a time chart of power supply to each induction heating apparatus.

Another object of the present invention is to provide an output monitoring apparatus and an output monitoring method capable of grasping an output situation from a power supply apparatus. Another object of the present invention is to provide an induction heating system having that output monitoring apparatus. Another object of the present invention is to provide an output monitoring apparatus and method and an induction heating system capable of monitoring whether electric power is being supplied according to a supply condition by an instruction of an induction heating apparatus.

Another object of the present invention is to provide an induction heating apparatus which requires a smaller space to arrange and can perform induction heating with flexibility as one of a plurality of induction heating apparatuses forming an induction heating system.

According to an aspect of the present invention, an induction heating system includes a plurality of induction heating apparatuses, each of the induction heating apparatuses including a high-frequency current transformer, a low-frequency current transformer, and a heating coil to which a secondary side of the high-frequency current transformer and a secondary side of the low-frequency current transformer are connected in parallel, a high-frequency input switch connected to a primary side of the high-frequency current transformer, a low-frequency input switch connected to a primary side of the low-frequency current transformer, a first power source configured to adjust a ratio of a high frequency output time and a low frequency output time with respect to an output period and to output a high-frequency electric power and a low frequency electric power, a second power source configured to output an electric power of a frequency that is different from a frequency of the electric power output from the first power source, a first power source output switch arranged to be connectable to a low-frequency output terminal of the first power source, a second power source output switch arranged to be connectable to an output terminal of the second power source, and a switch controller configured to control the high-frequency input switch and the low-frequency input switch for each of the induction heating apparatuses and to control the first power source output switch and the second power source output switch so as to connect at least one of the induction heating apparatuses to at least one of the first power source and the second power source. Each of the induction heating apparatuses further includes a heater controller configured to send a switching request signal to the switching controller to turn on one of the first power source output switch and the second power source output switch, to turn off the other of the first power source output switch and the second power source output switch, and to switch on or off each of the high-frequency input switch and the low-frequency input switch.

Upon receipt of the switching request signal, the switching controller controls the first power source output switch and the second power source output switch and also the high-frequency input switch and the low-frequency input switch that are connected to the induction heating apparatus from which the switching request signal is sent. The switching controller sends a switching completion signal to the induction heating apparatus when the switching controller has completed the control in accordance with the switching request signal. Upon receipt of the switching completion signal, the induction heating apparatus controls an output of the first power source and an output of the second power source.

According to another aspects of the present invention, an induction heating method includes providing a plurality of induction heating apparatuses each having a heating coil, a first power source configured to adjust a ratio of a high frequency output time and a low frequency output time with respect to an output period and to output a high-frequency electric power and a low frequency electric power, a second power source configured to output an electric power of a frequency that is different from a frequency of the electric power output from the first power source, and a switching section, operating the switching section from one of the induction heating apparatuses to select one of a first mode, a second mode, a third mode, and a fourth mode, and induction heating a workpiece arranged on the one of the induction heating apparatuses. In the first mode, the one of the induction heating apparatuses receives one of the high-frequency electric power and the low frequency electric power from the first power source. In the second mode, the one of the induction heating apparatuses receives the electric power from the second power source. In the third mode, the one of the induction heating apparatuses receives electric power of different frequencies from the first power source by a time-division method. In the fourth mode, the one of the induction heating apparatuses receives one of the high-frequency electric power and the low frequency electric power from the first power source and the electric power from the second power source in a superimposed manner.

According to the above aspects of the present invention, the power source system is configured to output a plurality of frequencies. The power source system can output, to the induction heating apparatuses, the high frequency and the low frequency simultaneously or alternately. Therefore, the ratio of the high frequency component and the low frequency component of the electric power supplied form the power source system to the induction heating apparatuses can be set optionally. Accordingly, when the output frequencies from the power source system are f1, f2 and f3, the effect (hereinafter, the "frequency effect") equivalent to a case in which an induction heating is performed with a frequency other than f1, f2 and f3 can be provided. Further, because the plurality of induction heating apparatuses are supplied with power from a single power source system, it is possible to downsize the system.

According to another aspect of the present invention, an output monitoring apparatus is adapted to be attached to one or more power supply apparatuses, each power supply apparatus including a converter configured to convert an alternate current into a direct current and an inverter configured to switch on and off, at an given frequency, the direct current input from the converter, the power supply apparatus being adapted to be connected to a single heating coil to supply power to the single heating coil. The output monitoring apparatus includes a measuring section configured to measure, at each sampling time, a current and a voltage of the direct current output from the converter to the inverter, and a processing unit configured to obtain an amount of electric power for each frequency from values of the current and the voltage measured at each sampling time by the measuring section, and to obtain an average electric power for each frequency based on the amount of electric power for each frequency.

The measuring section may include a current and voltage measuring unit configured to measure, at each sampling time, the current and the voltage of the direct current output from the converter to the inverter, and a frequency measuring unit configured to count the number of times of switching made by the inverter per unit time. The processing unit obtains the amount of electric power for each frequency from the values of the current and the voltage measured at each sampling time by the current and voltage measuring unit, and obtains the average electric power for each frequency based on the amount of electric power for each frequency The inverter may supply an output electric power of a high frequency and an output electric power of a low frequency from one of the power supply apparatuses to the single heating coil by time-division multiplexing by adjusting a ratio of a high frequency output time and a low frequency output time with respect to an output period. The processing unit obtains the average electric power for each of the high frequency and the low frequency output from the one of the power supply apparatuses based on values measure by the measuring section.

The one or more power supply apparatuses may include a first power supply apparatus and a second power supply apparatus, wherein the inverter of the first power supply apparatus switches on and off, at a first frequency, the direct current input from the converter of the first power supply apparatus, the inverter of the second power supply apparatus switches on and off, at a second frequency, the direct current input from the converter of the second power supply apparatus, wherein the electric power from the first and second power supply apparatuses to the single heating coil by superimposing the first frequency and the second frequency. The measuring section includes a first measuring unit configured to measure, at each sampling time, a current and a voltage of the direct current output from the converter to the inverter in the first power supply apparatus, and a second measuring unit configured to measure, at each sampling time, a current and a voltage of the direct current output from the converter to the inverter in the second power supply apparatus. The processing unit obtains the amount of electric power for the first frequency from the current and the voltage measured at each sampling time by the first measuring unit, the amount of electric power for the second frequency from the current and the voltage measured at each sampling time by the second measuring unit, and the average electric power for each frequency based on the amount of electric power for each frequency.

The power supply apparatus may be attached to a plurality of induction heating apparatus, each having a single heating coil, via a switching section such that the power supply apparatus is connectable to any one of the induction heating apparatuses by controlling the switching section from the plurality of induction heating apparatuses. The processing unit is provided for each of the induction heating apparatuses, and obtains the values measured by the measuring section to determine the consistency between the average electric power of each frequency and a supply command sent to the power supply apparatus.

According to another aspect of the present invention, an induction heating system includes a power supply apparatus having a converter configured to convert an alternate current into a direct current and an inverter configured to switch on and off, at an given frequency, the direct current input from the converter, a plurality of induction heating apparatuses, a switching section connected between the power supply apparatus and the plurality of induction heating apparatuses to output an electric power supplied from the power supply apparatus selectively to one of the induction heating apparatuses, and an output monitoring apparatus having a measuring section configured to measure, at each sampling time, a current and a voltage of the direct current output from the converter to the inverter, and a processing unit configured to obtain an amount of electric power for each frequency from values of the current and the voltage measured at each sampling time by the measuring section, and to obtain an average electric power for each frequency based on the amount of electric power for each frequency.

According to another aspect of the present invention, an induction heating system includes a first power supply apparatus having a converter configured to convert an alternate current into a direct current and an inverter configured to switch on and off, at a first frequency, the direct current input from the converter, a second power supply apparatus having a converter configured to convert an alternate current into a direct current and an inverter configured to switch on and off, at a second frequency, the direct current input from the converter, a plurality of induction heating apparatuses, a switching section configured to selectively connect at least one of the first power supply apparatus and the second power supply apparatus to one of the induction heating apparatuses, and an output monitoring apparatus having a measuring section configured to measure, at each sampling time, a current and a voltage of the direct current output from the converter to the inverter of each of the first power supply apparatus and the second power supply apparatus, and a processing unit configured to obtain an amount of electric power for each of the first frequency and the second frequency from values of the current and the voltage measured at each sampling time by the measuring section, and to obtain an average electric power for each of the first frequency and the second frequency based on the amount of electric power for each of the first frequency and the second frequency.

According to another aspect of the present invention, an output monitoring method includes measuring, at each sampling time, a current and a voltage of one or more direct current that is being switched on and off at a plurality of frequencies to perform an induction heating, and obtaining an average electric power for each of the frequencies by adding up, at each sampling time, a product of the current and the voltage that are measured while switching on and off at each of the frequencies and by dividing the added products by an induction heating time, thereby monitoring an output electric power from the obtained average electric power for each of the frequencies.

According to another aspect of the present invention, an output monitoring method includes measuring, at each sampling time, a current and a voltage of a direct current that is being switched on and off at a first frequency and a second frequency in a time-divided manner to output electric power of different frequencies to perform an induction heating by time-division multiplexing, obtaining an average electric power for the first frequency by adding up, at each sampling time, a product of the current and the voltage that are measured while switching on and off at the first frequency and by dividing the added products by an induction heating time, obtaining an average electric power for the second frequency by adding up, at each sampling time, a product of the current and the voltage that are measured while switching on and off at the second frequency and by dividing the added products by an induction heating time, and monitoring an output electric power from the obtained average electric power for each of the first frequency and the second frequency.

The output monitoring method may further include monitoring an anomaly of a signal designating switching between the first frequency and the second frequency, based on whether a value of the average electric power of the first frequency and a value of the average electric power of the second frequency change in time series.

According to another aspect of the present invention, an output monitoring method includes measuring, at each sampling time, a currents and a voltage of a first direct current and a second direct current while the first direct current is being switched on and off at a first frequency and the second direct current is being switched on and off at a second frequency in an alternating manner to perform an induction heating, obtaining an average electric power for the first frequency by adding up, at each sampling time, a product of the current and the voltage that are measured while switching on and off at the first frequency and by dividing the added products by an induction heating time, obtaining an average electric power for the second frequency by adding up, at each sampling time, a product of the current and the voltage that are measured while switching on and off at the second frequency and by dividing the added products by an induction heating time, and monitoring an output electric power from the obtained average electric power for each of the first frequency and the second frequency.

According to another aspect of the present invention, an output monitoring method includes measuring, at each sampling time, a currents and a voltage of a first direct current and a second direct current while the first direct current is being switched on and off at a first frequency and the second direct current is being switched on and off at a second frequency and the first frequency and the second frequency are being superimposed to perform an induction heating, obtaining an average electric power for the first frequency by adding up, at each sampling time, a product of the current and the voltage that are measured while switching on and off at the first frequency and by dividing the added products by an induction heating time, obtaining an average electric power for the second frequency by adding up, at each sampling time, a product of the current and the voltage that are measured while switching on and off at the second frequency and by dividing the added products by an induction heating time, and monitoring an output electric power from the obtained average electric power for each of the first frequency and the second frequency.

According to the aspects of the present invention described above, the current and the voltage of the direct current before being switched on and off at the first frequency, the second frequency or other optional frequencies are measured at each sampling time, and the electric power is obtained for each frequency from the values of the measured current and voltage of the direct current in each sampling time. Therefore, it is possible to monitor the actually output electric power, which has not been realized in the past. Accordingly, even when an output is made by time-division multiplex method or superimposing method using one or more power supply apparatuses, the output condition can be monitored. Also, even when the frequency at which the direct current is switched on and off is designated optionally, the actually output electric power can be monitored. For example, even when one of the induction heating apparatuses and the power supply apparatus are connected to supply electric power by controlling the power supply apparatus from the induction heating apparatuses, and thereafter switching the induction heating apparatus to be connected to the power supply apparatus, it is possible to monitor whether the power supply apparatus is outputting the electric power in line with the supply conditions instructed by the induction heating apparatus.

According to another aspect of the present invention, an induction heating apparatus includes a heating coil, and a low-frequency current transformer and a high-frequency current transformer that are connected in the heating coil in parallel manner. The low-frequency current transformer includes a primary winding, a secondary winding, and a core coupling the primary winding and the secondary winding. The high-frequency current transformer includes a primary winding and a secondary winding. The low-frequency current transformer is arranged below the high-frequency current transformer. The induction heating apparatus may be configured such that the heating coil selected from a plurality of heating coils having different impedances is attachable, and such that the low-frequency current transformer selected from a plurality of low-frequency current transformers having different number of turns of primary and secondary windings that satisfies an impedance matching condition corresponding to the heating coil is attachable.

The induction heating apparatus may further include a mounting frame supporting the low-frequency current transformer and the high-frequency current transformer, and a replacing mechanism provided on the mounting frame to replace the low-frequency current transformer. The replacing mechanism includes a front-rear direction support extending in a front-rear direction of the mounting frame, and a carriage on which the low-frequency current transformer is mounted and moves on the front-rear direction support. When the carriage is moved forward, the low-frequency current transformer is arranged at a position at which the low-frequency current transformer is connected to the heating coil. When the carriage is moved backward, the low-frequency current transformer is arranged at a position at which the low-frequency current transformer does not overlap the high-frequency current transformer in a vertical direction.

The replacing mechanism may further include a base plate having a traveling surface for the carriage and supported on the front-rear direction support such that the base plate is displaceable in the front-rear direction, front displacement means connecting the base plate and the mounting frame to displace the base plate forward with respect to the mounting frame, an inclined member arranged at a front end side of the front-rear direction support such that a front end side of the base plate is placed thereon and having a front-high inclination, and a vertical displacement means arranged at a rear end side of the base plate to displace the rear end side of the base plate in a vertical direction with respect to the mounting frame. The vertical displacement means may displace the base plate forward to place the front end side of the base plate on the inclined member. The front displacement means and the vertical displacement means may be arranged on the rear end side of the base plate.

According to the aspects of the present invention described above, because the low-frequency current transformer and the high-frequency current transformer are arranged on top of one another, the arrangement space is reduced and downsizing is possible. Further, because the low-frequency current transformer has the core and therefore is heavier than the high-frequency current transformer, by arranging the low-frequency current transformer below the high-frequency current transformer, the gravity center of the apparatus is lowered, whereby the entire apparatus can be installed in a stable manner

BRIEF DESCRIPTION OF DRAWINGS

FIG. 8A is a partial plan view illustrating the vicinities of the rear ends of a carriage and a base plate in the induction heating apparatus shown in FIG. 6, and FIG. 8B is a partial side view illustrating the carriage.

FIG. 10A is a view illustrating a situation in which a low-frequency current transformer is put on a mounting frame, FIG. 10B is a view illustrating a process of transposing the low-frequency current transformer from the status of FIG. 10A onto the carriage, and FIG. 10C is a view illustrating a situation where the low-frequency current transformer is mounted on a carriage plate and is taken out.

FIGS. 12A and 12B are a plan view and a front view illustrating the configuration of each switch in the induction heating system of FIG. 1, respectively.

FIG. 14 is a view illustrating a sequence in which each induction heating apparatus performs induction heating on a workpiece by the induction heating system of FIG. 1, and shows a case where the first induction heating apparatus receives power supply from the first power source and a second power source by a superimposing method, and performs induction heating.

FIG. 15 is a time chart illustrating how many induction heating apparatuses one power source system can supply electric power to. In FIG. 15, (a) shows a case of using two induction heating apparatuses, (b) shows a case of using three induction heating apparatuses, and (c) shows a case of using five induction heating apparatuses.

FIGS. 16A to 16D are views illustrating examples of condition setting screens which are used in a case of using each induction heating apparatus to set a heating condition to a system control unit including a switching controller. More specifically, FIG. 16A shows an example of condition settings of steps, FIG. 16B shows a first set table of the time-division method, FIG. 16C shows a second set table of the time-division method, and FIG. 16D is a first table of the superimposing method.

FIG. 17 is a view illustrating an example of an output monitoring screen.

In FIG. 19, (a) shows changes of a DC voltage and a DC current with time, and (b) to (e) show changes of a DT signal, integral low-frequency power consumption, integral high-frequency power consumption, and a heat signal with time, respectively.

DESCRIPTION OF EMBODIMENTS

Hereinafter, an induction heating system according to an embodiment of the present invention will be described in detail with reference to the drawings.

Overall Configuration of Induction Heating System

Figure 1:
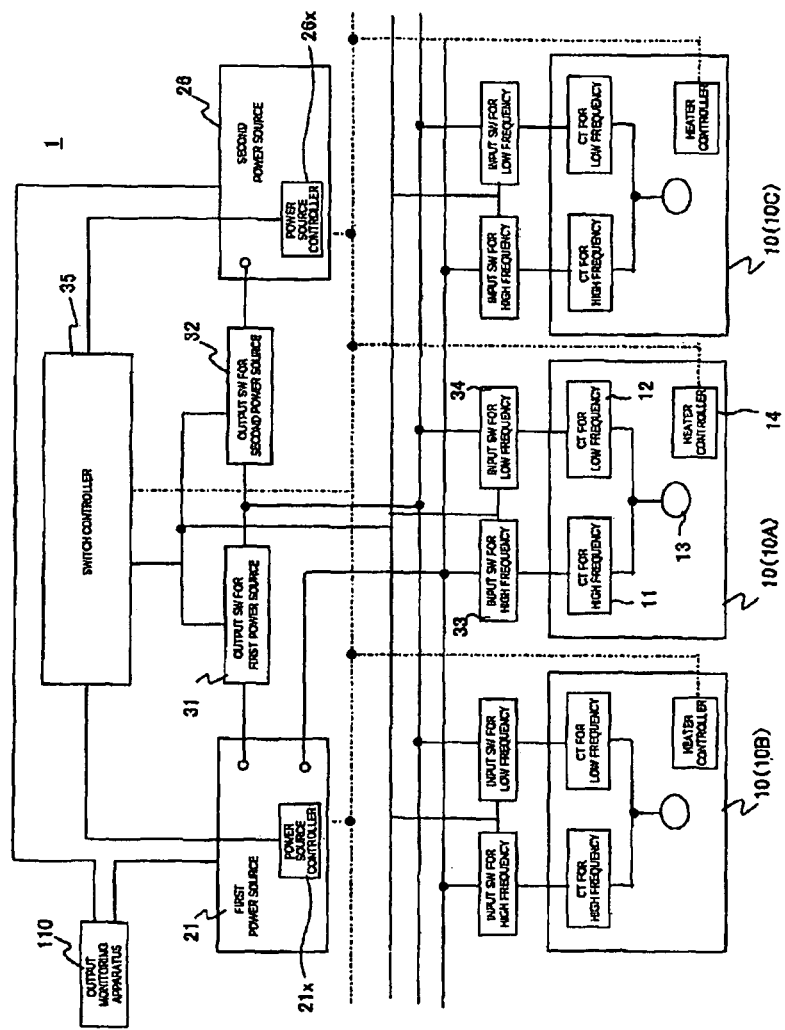
FIG. 1 is a view illustrating the configuration of an induction heating system according to an embodiment of the present invention.

FIG. 1 is a view illustrating the configuration of an induction heating system according to an embodiment of the present invention. As shown in FIG. 1, an induction heating system 1 according to an embodiment of the present invention includes a plurality of induction heating apparatuses 10, a power source system 20 including a first power source 21 and a second power source 26, and switching section 30 which are interposed between the power source system 20 and the induction heating apparatuses 10 and switch connection between the power source system 20 and the induction heating apparatuses 10. The switching section 30 include an output switch 31 for the first power source which is connected to the first power source 21, an output switch 32 for the second power source which is connected to the second power source 26, and high-frequency input switches 33 and low-frequency input switches 34 where are connected to the input sides of the individual induction heating apparatuses 10. In FIG. 1, three induction heating apparatuses 10 are shown. However, two, or four or more, or one induction heating apparatus may be provided. Hereinafter, with respect to a case where three induction heating apparatuses are provided, the configuration of each unit will be described.

Induction Heating Apparatus

In FIG. 1, as the induction heating apparatuses 10, first, second, and third induction heating apparatuses 10A, 10B, and 10C are provided. Each of the induction heating apparatuses 10 includes a high-frequency current transformer 11, a low-frequency current transformer 12, a heating coil 13, and a heater controller 14.

Each of the high-frequency current transformers 11 and the low-frequency current transformers 12 includes a primary winding and a secondary winding. The turn ratio of each induction heating apparatus 10 depends on whether the induction heating apparatus is for a high frequency or a low frequency. Each of high-frequency current transformers 11 and the low-frequency current transformers 12 may have a core such as an iron core. Every high-frequency current transformer 11 may have an air core, not a core. Whether the high-frequency current transformers 11 have cores depends on the induction heating apparatuses 10. In other words, in at least one of the induction heating apparatuses 10 of the induction heating system 1, the high-frequency current transformer 11 has an air core, not a core, and the low-frequency current transformer 12 has a core.

In each of the high-frequency current transformers 11 and the low-frequency current transformers 12, the secondary winding is connected in parallel to the heating coil 13. Here, the shapes and dimensions of the heating coils 13 are selected according to workpieces to be subjected to induction heating in the individual induction heating apparatuses 10. Therefore, the impedances of the heating coils 13 depend on the heating coils 13.

Power Source System

The power source system 20 includes the first power source 21 and the second power source 26.

Figure 2:
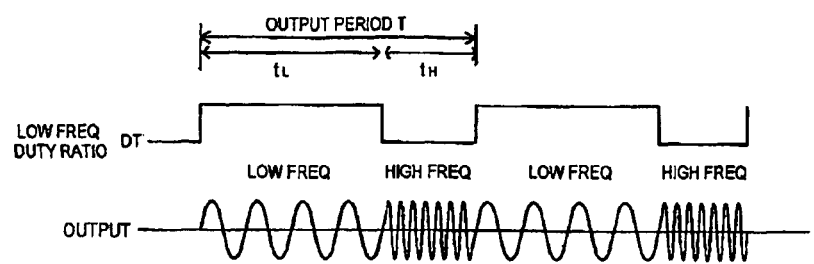
FIG. 2 is a view schematically illustrating a waveform which is output from a first power source in FIG. 1.

The first power source 21 changes the ratios of a high frequency output time and a low frequency output time with respect to an output period, and outputs electric power of different frequencies. The first power source 21 alternately outputs a high frequency such as 200 kHz and a low frequency such as 10 kHz in a short time. The first power source 21 adjusts the output ratio of the high frequency and the low frequency in a time (referred to as an output period) T, between 0% and 100%. FIG. 2 is a view schematically illustrating a waveform which is output from the first power source 21. The horizontal axis represents time, and the vertical axis represents the duty ratio DT of the low frequency and output intensities. As shown in FIG. 2, in the output period T such as 100 msec, in a time $t_L$, the low frequency is output, and in a time $t_H$, the high frequency is output. The duty ratio of the low frequency is set to 100% in a case where only a low-frequency voltage or current is output from the first power source 21 in the output period, and is set to 0% in a case where only a high-frequency voltage or current is output. The output period T is the sum of the time $t_L$ and the time $t_H$, and the ratio ($t_L$/T) of the time $t_L$, when only the low frequency is output, with respect to the output period T will be referred to as an output ratio, and the output ratio $t_L/T$ can be arbitrarily set within a range from 0 to 1. The output ratio is the duty ratio of the low frequency. Also, the duty ratio of the high frequency is defined as a value obtained by subtracting the duty ratio of the low frequency from 1. Therefore, the output ratio may be set to 0% such that the first power source 21 outputs only the high frequency, or may be set to 100% such that the first power source 21 outputs only the low frequency.

The second power source 26 outputs electric power of a frequency different from the output frequencies of the first power source 21. For example, the second power source 26 outputs electric power of a low frequency such as 3 kHz or 8.5 kHz. Therefore, only the second power source 26 may supply electric power to each induction heating apparatus 10, or the first power source 21 may output the high frequency and the second power source may output only the low frequency such that electric power is supplied to the heating coil of each induction heating apparatus 10 by the synthetic wave of the high frequency and the low frequency.

In the embodiment of the present invention, since the first power source 21 and the second power source 26 supply electric power at different frequencies to each induction heating apparatus 10, it is possible to heat workpieces to different depths from the outer surfaces of the workpieces and to different temperatures. A more detailed description will be made below.

Switching Section

The switching section 30 include a plurality of switches to switch connection of the power source system 20 of the first power source 21 and the second power source 26 with the individual induction heating apparatuses 10. The switching section 30 includes the first power source output switch 31 connected to the low frequency output terminal of the first power source 21, the second power source output switch 32 connected to the output terminal of the second power source 26, the high-frequency input switches 33 and the low-frequency input switches 34 of the individual induction heating apparatuses 10, and a switching controller 35 generally controls switching of the individual switches 31 to 34.

In each induction heating apparatus 10, the high-frequency input switch 33 is connected to the primary winding of the high-frequency current transformer 11, and the low-frequency input switch 34 is connected to the primary winding of the low-frequency current transformer 12. The switching controller 35 controls the output switch 31 for the first power source, the output switch 32 for the second power source, and the high-frequency input switches 33 and the low-frequency input switches 34 of the individual induction heating apparatuses 10.

Power Supply Method from Power Source System to Each Induction Heating Apparatus by Switching Section As has been known, due to skin effect, at a low frequency, an eddy current flows up to an area deep from the outer surface of a workpiece, and at a high frequency, an eddy current flows only near the outer surface of a workpiece, that is, in a shallow area. On the basis of this effect, in various induction heating treatments such as quenching and tempering, it is possible to control the depths of hardened layers by frequency differences. In this specification, this effect will be referred to as frequency effect. When an induction heating treatment is actually performed, in order to obtain a hardened layer of an appropriate thickness, a power source for outputting an appropriate frequency is selected.

The induction heating system shown in FIG. 1 includes the power source system 20 which is the combination of two kinds of power sources, that is, the first power source 21 and the second power source 26. Therefore, it is possible to use only the first power source 21 to supply electric power by the time-division method, and it is also possible to supply electric power to each heating coil 13 by the so-called superimposing method of superimposing the high frequency output from the first power source 21 and the low frequency output from the second power source 26. In a case of using the time-division method, the output ratio of the high frequency fH and the low frequency fL output from the first power source 21 is controlled. Therefore, the effect of induction heating by a frequency f between the high frequency fH and the low frequency fL (fL<f<fH) (hereinafter, this effect will be referred to as frequency effect) is obtained. In a case of using the superimposing method, the power ratio of frequencies, that is, the high frequency output from the first power source 21 and the low frequency output from the second power source 26 are controlled. Therefore, induction heating effect by a frequency between the high frequency and the low frequency is obtained. In other words, not only in the time-division method but also in the superimposing method, the single power source system 20 has a multi-frequency power source function.

In the switching section 30, a high-frequency input switch 33 and a low-frequency input switch 34 connected to an optional one of the induction heating apparatuses 10 can be turned on so as to supply electric power from the power source system 20 to the induction heating apparatus 10. Therefore, it is possible to use the single power source system 20 to supply electric power according to a heating condition to each induction heating apparatus 10.

Since the embodiment of the present invention is fully equipped with the power source system 20 for outputting a plurality of frequencies as described above, it is possible to simultaneously or alternately output the high frequency and a low frequency from the power source system 20 to each induction heating apparatus 10. Therefore, it is possible to arbitrarily select the ratio of the low frequency component and the high frequency component of electric power to be supplied from the power source system 20 to each induction heating apparatus 10, and to obtain the frequency effect by induction heating.

Further, as shown in FIG. 1, one or more the induction heating apparatuses 10 are connected to the single power source system 20 in accordance with connection switching by the switching controller 35, and for example, frequency selection, output ratio adjustment, and setting of various parameters such as intensities of the high frequency and the low frequency are performed through the switching controller 35. Therefore, in each induction heating apparatus 10, it is possible to perform induction heating such that appropriate frequency effect is obtained. Since the single power source system 20 is used, the rate of utilization of the power source system 20 increases, and space-saving effect and energy-saving effect according to efficient induction heating by an optimal frequency are obtained.

Here, each induction heating apparatus 10 has a heater controller 14, and the heater controller 14 is connected to the switching controller 35. The switching controller 35 is connected to a power source controller 21x of the first power source 21, a power source controller 26x of the second power source 26, the output switch 31 for the first power source, the output switch 32 for the second power source, and the high-frequency input switches 33 and the low-frequency input switches 34 connected to the individual induction heating apparatuses 10. Therefore, all signals from the first power source 21, the second power source 26, and the heater controllers 14 of the individual induction heating apparatuses 10 are input to the switching controller 35. All command signals to the first power source 21, the second power source 26, the heater controllers 14 of the individual induction heating apparatuses 10, and the high-frequency input switches 33 and the low-frequency input switches 34 connected to the individual induction heating apparatuses 10 are output by the switching controller 35. For these reasons, the switching controller 35 may be called a system control unit.

Electric Circuit Configuration in Induction Heating System

Now, the circuit configuration between the power source system 20 and a heating coils 13 will be described in more detail, taking as an example a case where in the induction heating system 1 shown in FIG. 1, the switching controller 35 switches on the output switch 31 for the first power source, switches off the output switch 32 for the second power source, switches on the high-frequency input switch 33 and the low-frequency input switch 34 connected to the first induction heating apparatus 10A, and switches off the high-frequency input switches 33 and the low-frequency input switches 34 connected to the other induction heating apparatuses 10B and 10C. This circuit configuration is similarly applied even in a case of switching on a high-frequency input switch 33 and a low-frequency input switch 34 connected to a specific induction heating apparatus 10B or 10C other than the first induction heating apparatus 10A. However, since the distances of power supply paths between the power source system 20 and the individual induction heating apparatuses 10 depend on the induction heating apparatuses 10, the inductances of the power supply paths are different. With respect to this matter, in order for simplifying explanation, differences among the circuit constants of the power supply paths will not be mentioned.

Figure 3:
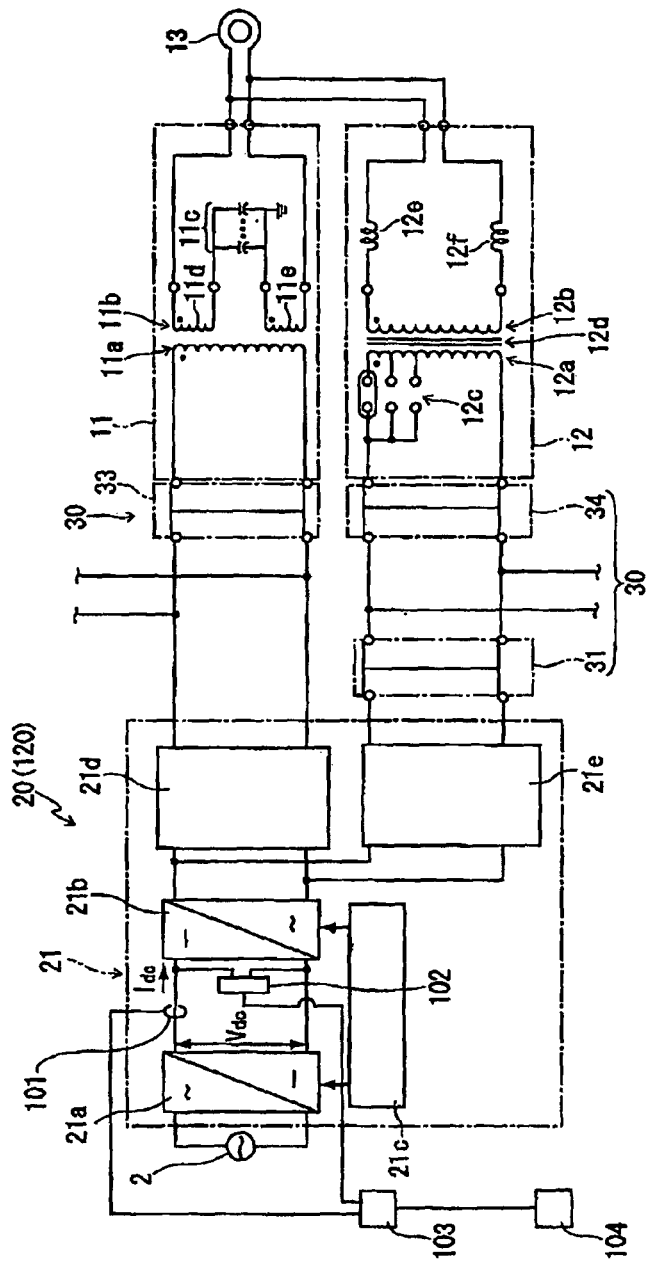
FIG. 3 is a circuit diagram illustrating a circuit configuration between a power source system and a heating coil in the induction heating system shown in FIG. 1.

FIG. 3 is a circuit diagram illustrating the circuit configuration between the power source system 20 and a heating coil 13 in the induction heating system shown in FIG. 1. FIG. 3 shows a case where the output switch 31 for the first power source, and a high-frequency input switch 33 and a low-frequency input switch 34 connected to one of the induction heating apparatuses are in ON states. The first power source 21 serving as the power source system 20 has a high frequency output terminal and a low frequency output terminal. To the high frequency output terminal, the primary side of the high-frequency current transformer 11 is connected. To the low frequency output terminal, the low-frequency current transformer 12 is connected. The heating coil 13 is connected in parallel to each of the secondary sides of the high-frequency current transformer 11 and the low-frequency current transformer 12.

The first power source 21 includes a converter 21a configured to convert commercial power supplied from a commercial power source 2 into a direct current, and an inverter 21b configured to convert the direct current output from the converter 21a into a given frequency. Both of the converter 21a and the inverter 21b are controlled by an inverter control unit 21c serving as the power source controller 21x, and particularly, the inverter 21b converts the direct current into a designated frequency according to a control signal from the inverter control unit 21c. With respect to the inverter 21b, a highpass filter 21d and a lowpass filter 21e are connected in parallel. The high frequency output terminal is provided on the output side of the highpass filter 21d, and the low frequency output terminal is provided on the output side of the lowpass filter 21e.

In the high-frequency current transformer 11, a transformer is configured by a primary winding 11a and a secondary winding 11b. In the case shown in FIG. 3, the secondary winding 11b is connected in series to two coils 11d and 11e. Between the coil 11d and the coil 11e, a capacitor 11c is interposed. The capacity of the capacitor 11c is set such that the capacitor 11c has low impedance with respect to the high frequency and has high impedance with respect to the low frequency. Then, it is possible to apply electric power with a good balance of the high frequency and the low frequency to the heating coil 13.

In the low-frequency current transformer 12, a transformer is configured by a primary winding 12a and a secondary winding 12b. In the case shown in FIG. 3, a plurality of taps 12c is attached to the primary winding 12a such that it is possible to adjust the number of turns. A core 12d such as an iron core is provided to facilitate mutual induction of the primary winding 12a and the secondary winding 12b. Further, to both ends of the secondary winding 12b, bus bars are connected, respectively, and each of the bus bars is connected to the heating coil 13. In FIG. 3, the bus bars are shown as their impedances 12e and 12f. The impedances 12e and 12f form a kind of filter, such that the high frequency is not input from the high-frequency current transformer 11 to the low-frequency current transformer 12.

As described above, each of the high-frequency current transformer 11 and the low-frequency current transformer 12 includes not only the transformer composed of the primary winding and the secondary winding but also a matching circuit for taking impedance matching between the heating coil 13 and the power source system 20. Also, since the high-frequency current transformer 11 and the low-frequency current transformer 12 are connected in parallel to the heating coil 13, they includes filter circuits, respectively, such that even if the low frequency flows into the secondary side of the high-frequency current transformer 11, the low frequency cannot be input to the secondary winding 11b, and even if the high frequency flows into the secondary side of the low-frequency current transformer 12, the high frequency cannot be input to the secondary winding 12b. Therefore, each current transformer may also be called a regulator circuit including a transformer, a matching circuit, and a filter circuit.

Figure 4:
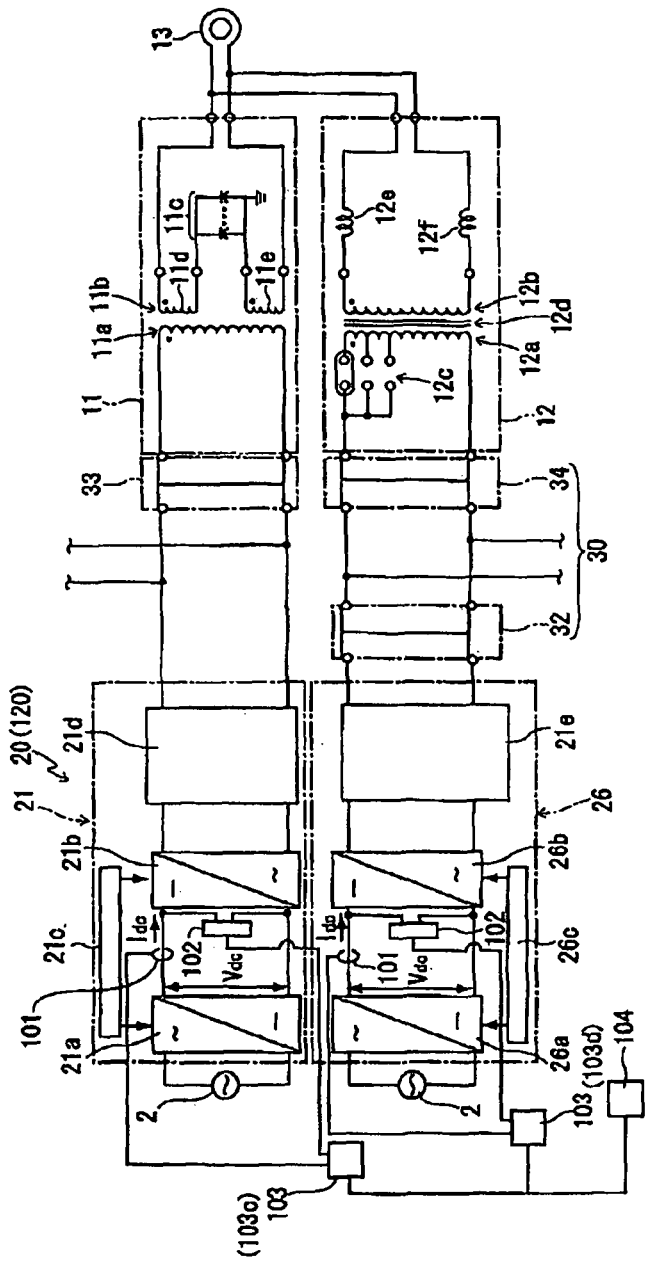
FIG. 4 is a circuit diagram illustrating another circuit configuration between the power source system and the heating coil in the induction heating system shown in FIG. 1.

FIG. 4 is a circuit diagram illustrating another circuit configuration between the power source system 20 and a heating coil 13 in the induction heating system shown in FIG. 1. FIG. 4 shows a case where the output switch 32 for the second power source, and a high-frequency input switch 33 and a low-frequency input switch 34 connected to on of the induction heating apparatuses are in ON states.

The circuit shown in FIG. 4 is different from the circuit shown in FIG. 3 in that the second power source 26 is connected to the low-frequency current transformer 12 through the output switch 32 for the second power source. For example, as shown in FIG. 4, the second power source 26 has the same circuit configuration as that of the first power source 21. However, the second power source 26 is different from the first power source 21 in that, of control of an inverter control unit 26c, serving as the power source controller 26x, on a converter 26a and an inverter 26b, control on the inverter 26b always makes electric power of a specific frequency be output.

Arrangement of High-Frequency Current Transformer and Low-Frequency Current Transformer In the system configuration shown in FIG. 1, each induction heating apparatus 10 includes a high-frequency current transformer 11 and a low-frequency current transformer 12. As described above, the high-frequency current transformer 11 has no core, whereas the low-frequency current transformer 12 has a core. The reason why the high-frequency current transformer 11 has no core is that, at a high frequency, a voltage which is applied to the primary side of a transformer is higher than that at a low frequency, and thus it is difficult to easily make a transformer with a core capable of withstanding that high voltage.

In general, a core is composed of an iron core or the like. Therefore, the low-frequency current transformer 12 is heavier than the high-frequency current transformer 11. For this reason, in a case of arranging the high-frequency current transformer 11 and the low-frequency current transformer 12 one above the other, the low-frequency current transformer 12 with the core is disposed on the lower side, and on the low-frequency current transformer 12, the high-frequency current transformer 11 is disposed (see FIG. 6). Therefore, it is possible to reduce the dimensions of the induction heating apparatus 10 in a plan view, as compared to a case where the high-frequency current transformer 11 and the low-frequency current transformer 12 are arranged horizontally, side by side. Particularly, in a case of using the single power source system 20 to supply electric power to the plurality of induction heating apparatuses 10 as shown in FIG. 1, it is preferable to make the distances between the power source system 20 and the induction heating apparatuses 10 as short as possible. In this case, connection wirings such as bus bars between the power source system 20 and the induction heating apparatuses 10 are short, and thus the influence of the connection wirings on an inductance component may not need to be considered. Further, between the power source system 20 and the induction heating apparatuses 10, voltage drop is suppressed.

Replacement of Low-Frequency Current Transformer—1

In the induction heating system 1 according to the embodiment of the present invention, the heating coils 13 according to the shapes and dimensions of heat treatment areas of workpieces are designed and are disposed in the induction heating apparatuses 10, and according to the heating conditions of workpieces, whether to combine the frequencies, the magnitude of each frequency, and so on are selected. Further, in order to perform induction heating on workpieces of different kinds, the heating coils 13 designed according to the heating conditions for each workpiece are attached in the individual induction heating apparatuses 10, and according to the heating conditions set for the individual induction heating apparatuses 10 by the single power source system 20, electric power is supplied from the power source system 20 to the induction heating apparatuses 10. Therefore, the heating coils 13 are different for each induction heating apparatus 10.

In a case where the high-frequency current transformer 11 has the primary winding 11a and the secondary winding 11b but does not have a core such as an iron core as described above, it is difficult for a change in the impedance of the heating coil 13 connected to the output terminal side of the high-frequency current transformer 11 to be transmitted to the power source system 20. Therefore, in a case where the heating coil 13 has high impedance, a change in the impedance of the load side seen from the power source system 20 does not increase.

However, the low-frequency current transformer 12 includes the primary winding 12a and the secondary winding 12b, and includes the core 12d such as an iron core to improve coupling between the primary winding 12a and the secondary winding 12b. For this reason, if the heating coil 13 connected to the output terminal side of the low-frequency current transformer 12 is replaced, it is easy for a change in the impedance of the heating coil 13 to be transmitted to the power source system 20. Therefore, in a case where the heating coil 13 has high impedance, the impedance of the load side seen from the power source system 20 becomes high, and it becomes difficult to take impedance matching.

For this reason, in a case of replacing the heating coil 13, it may be necessary to replace the low-frequency current transformer 12 with one different in the turn ratio of the primary winding 12a and the secondary winding 12b. Regarding this point, it can be considered to provide a number of taps to the primary winding 12a in the low-frequency current transformer 12 as shown in FIG. 3, thereby widening the adjustable range of the turn ratio. However, in the case where a number of taps are provided to the primary winding 12a, for example, in a transformer having taps from 4 T up to 8 T according to the number of turns, if induction heating is performed on a workpiece capable of taking matching at the tap of 4 T, a voltage which is twice a voltage on the tap of 4 T is generated at the tap of 8 T. Since a voltage on the primary winding 12a becomes an extremely high voltage, for example, the maximum 4000 V, according to a matching condition, if this voltage is applied to the tap of 4 T, at the tap of 8 T, a voltage of 8000 V is generated. Further, since the output of the first power source 21 is extremely large as the maximum 600 kW, a possibility that insulation breakdown such as a spark will occur increases. Therefore, it is not practical to provide many taps for switching to the primary winding of the low-frequency current transformer 12.

Replacement of Low-Frequency Current Transformer—2

Figure 5:
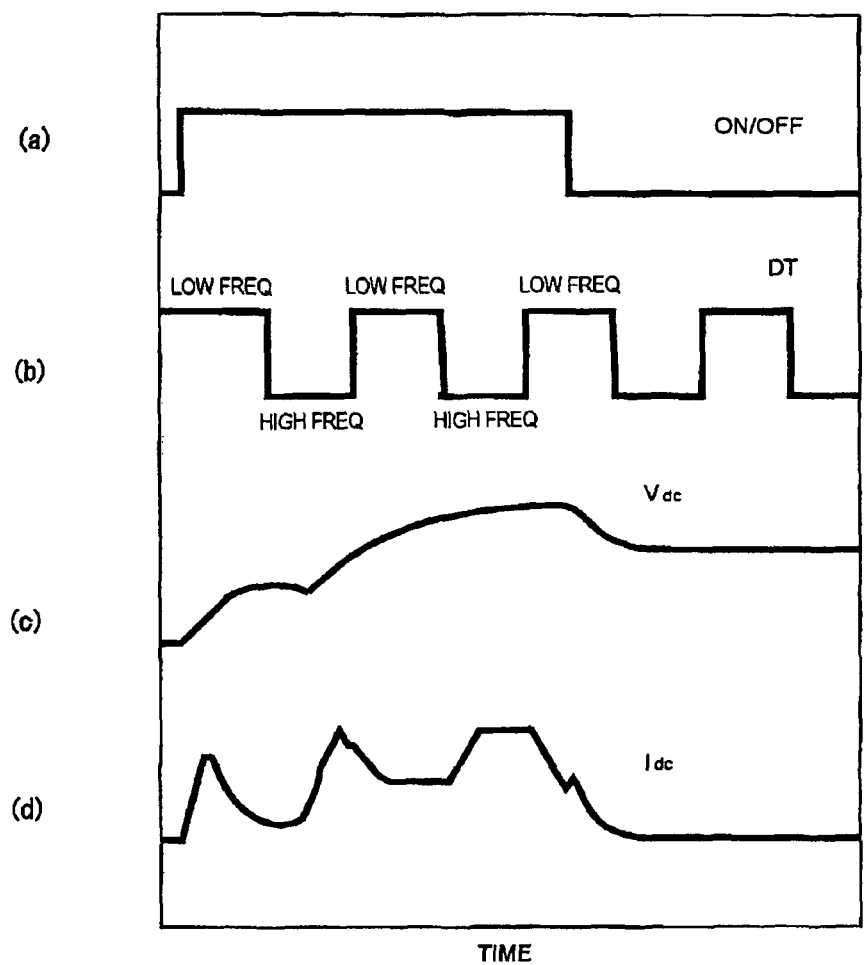
FIG. 5 is a view schematically illustrating signal waveforms which are output and controlled from the first power source shown in FIG. 3.

In a case of alternately supplying the high frequency and the low frequency from the power source system 20 to the heating coil 13 by the time-division method, taking impedance matching is more difficult at the low frequency than at the high frequency. FIG. 5 is a view schematically illustrating signal waveforms which are output and controlled from the first power source 21 shown in FIG. 3. The horizontal axis represents time, and the vertical axis represents signal intensities. In FIG. 5, (a) shows the waveform of ON/OFF of the output from the first power source 21, (b) shows the waveform of the duty ratio of the low frequency, (c) shows the waveform of a DC voltage Vdc of the first power source 21, and (d) shows a DC current Idc of the first power source 21.

In a case of switching on the output of the first power source 21 to alternately output the low frequency and the high frequency, if a low frequency output status transitions to a high frequency output status, the DC current Idc starts to increase. In contrast, if the high frequency output status transitions to the low frequency output status, the DC current Idc starts to decrease. With respect to the impedance of the load seen from the power source system 20, for example, in a case where the impedance of the high frequency is lower than the impedance of the low frequency as shown in FIG. 5, that is, in a case where the impedance difference between the high frequency and the low frequency is large, the DC current Idc increases or decreases as shown in FIG. 5 whenever switching is performed between the high frequency and the low frequency. Therefore, it is preferable to adjust the impedances of the high frequency and the low frequency seen from the power source side to the same degree. For this adjustment, the low-frequency current transformer is replaced.

Arrangement and Configuration of Each Part of Induction Heating Apparatus

Therefore, in the embodiment of the present invention, it is possible to provide a mechanism for replacing the low-frequency current transformer (hereinafter, referred to as a replacing mechanism), for example, by retrofitting. As a premise to explain the replacing mechanism, the arrangement, configuration, and the like of the high-frequency current transformer 11, the low-frequency current transformer 12, the heating coil 13, and a power supply path (hereinafter, referred to as a "power transmission bus bar", or simply as a "bus bar") for electrically connecting them in the induction heating apparatus 10 will be described.

Overall Configuration of Induction Heating Apparatus

Figure 6:
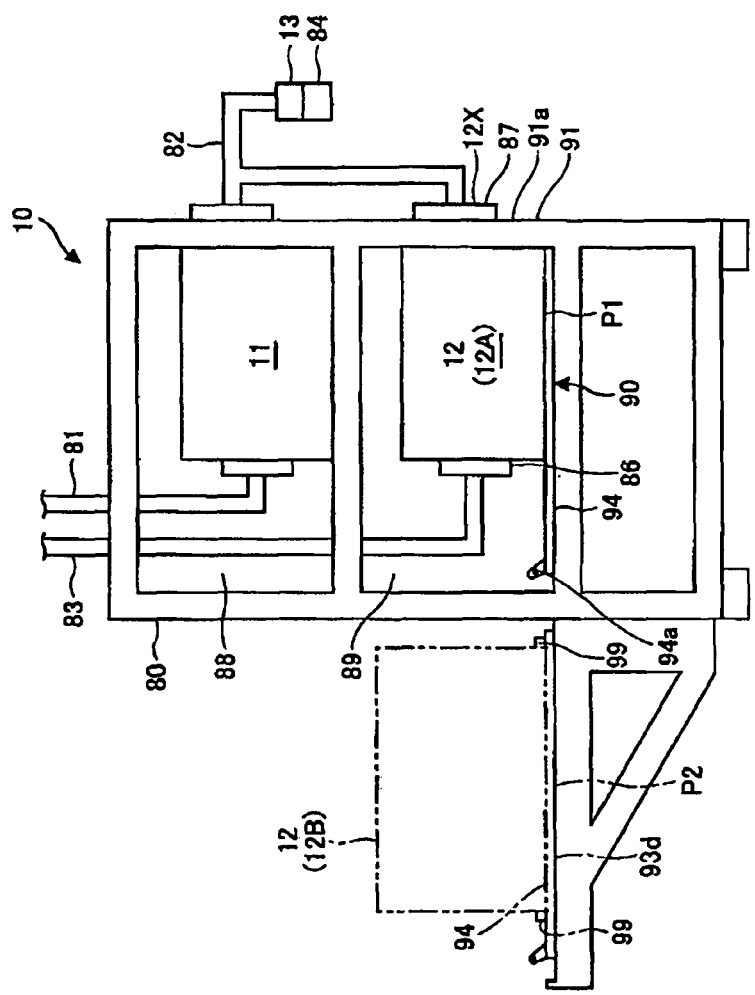
FIG. 6 is a side view schematically illustrating the arrangement and configuration of an induction heating apparatus shown in FIG. 1.

FIG. 6 is a side view schematically illustrating the arrangement and configuration of the induction heating apparatus. In the induction heating apparatus 10, as shown in FIG. 6, the low-frequency current transformer 12 and the high-frequency current transformer 11 are mounted and supported on a mounting frame 80. The low-frequency current transformer 12 and the high-frequency current transformer 11 are connected to switches (not shown in FIG. 6) through primary-side bus bars 81 and 83, respectively, and are connected in parallel to the heating coil 13 through a secondary-side bus bar 82. Hereinafter, on the assumption of a quenching machine for heating and cooling a workpiece, a description will be made.

FIG. 6 shows a replacing mechanism 90 constructed as a supplement by assembling various members such that in a case where any mechanism for replacing the low-frequency current transformer 12 is not originally provided on the mounting frame 80, it is possible to replace the low-frequency current transformer 12 disposed on the mounting frame 80. In order to make it possible to withdraw the low-frequency current transformer 12 to the rear (to the observer's left side in FIG. 6), as another replacing mechanism, rollers may be provided at the lower end portions of both side surfaces of the low-frequency current transformer 12, and a guide member such as a rail for guiding the low-frequency current transformer 12 to the rear may be attached to the mounting frame 80. In this case, a replacing mechanism simpler than the replacing mechanism 90 to be described below with reference to FIGS. 6 to 10C can be assembled.

Heating Coil

The heating coil 13 is connected to the plate-like secondary-side bus bar 82 connected to the high-frequency current transformer 11 and the low-frequency current transformer 12 such that the heating coil 13 is supported by the secondary-side bus bar. In the induction heating apparatus 10, as the heating coil 13, one having a shape and dimensions corresponding to the heat treatment area of a workpiece is selected and mounted. In the induction heating apparatus 10, a quenching-liquid injection nozzle 84 for injecting quenching liquid after induction heating is provided.

Current Transformer

The high-frequency current transformer 11 includes the primary winding and the secondary winding as described above. In the primary winding and secondary winding of the high-frequency current transformer 11, liquid paths are provided, respectively, to allow cooling liquid from a cooling liquid system (not shown) to pass.

The low-frequency current transformer 12 includes the primary winding, the secondary winding, and the core as described above. The core links the primary winding and the secondary winding. In the present embodiment, a plurality of low-frequency current transformers 12 different in the number of turns of the primary winding and the secondary winding is prepared, and from them, one corresponding to the heating coil 13 and satisfying an impedance matching condition is selected and is disposed on the mounting frame 80. Even in the primary winding and secondary winding of the low-frequency current transformer 12, liquid paths are provided, respectively, to allow the cooling liquid from the cooling liquid system (not shown) to pass.

On the rear end surface of the low-frequency current transformer 12, a connector 86 is provided, and the primary-side bus bar 83 is connected to the connector 86 such that the primary-side bus bar is removable. On the front end portion of the low-frequency current transformer 12, a connector 87 is provided, and the secondary-side bus bar 82 is connected to the connector 87 such that the second bus bar is removable. The liquid paths of the primary winding and secondary winding of the low-frequency current transformer 12 are connected to the cooling liquid system through couplers, respectively, and are separable by the couplers. If the connection is released such that the liquid paths are separated from the couplers, the internal valves of the couplers close flow paths.

Mounting Frame

The mounting frame 80 is formed of a steel angle material in a hollow and solid shape. The mounting frame 80 includes an upper supporting section 88 for supporting the high-frequency current transformer 11 at the upper portion, and a lower supporting section 89 provided below the upper supporting section 88 for supporting the low-frequency current transformer 12. In front of the upper supporting section 88 and the lower supporting section 89, the heating coil 13 is disposed. The front surfaces of the upper supporting section 88 and the lower supporting section 89 are covered by cover members 91 for partitioning the upper supporting section and the lower supporting section off from a heating position. As long as the mounting frame 80 has this configuration, the shape of the mounting frame is not limited to the shape shown in FIG. 6.

Replacing Mechanism

As described above, in a case where there is a simple replacing mechanism attached on the mounting frame 80, this replacing mechanism can be used. In a case where there is no replacing mechanism on the mounting frame 80, the following replacing mechanism is prepared.

Figure 7:
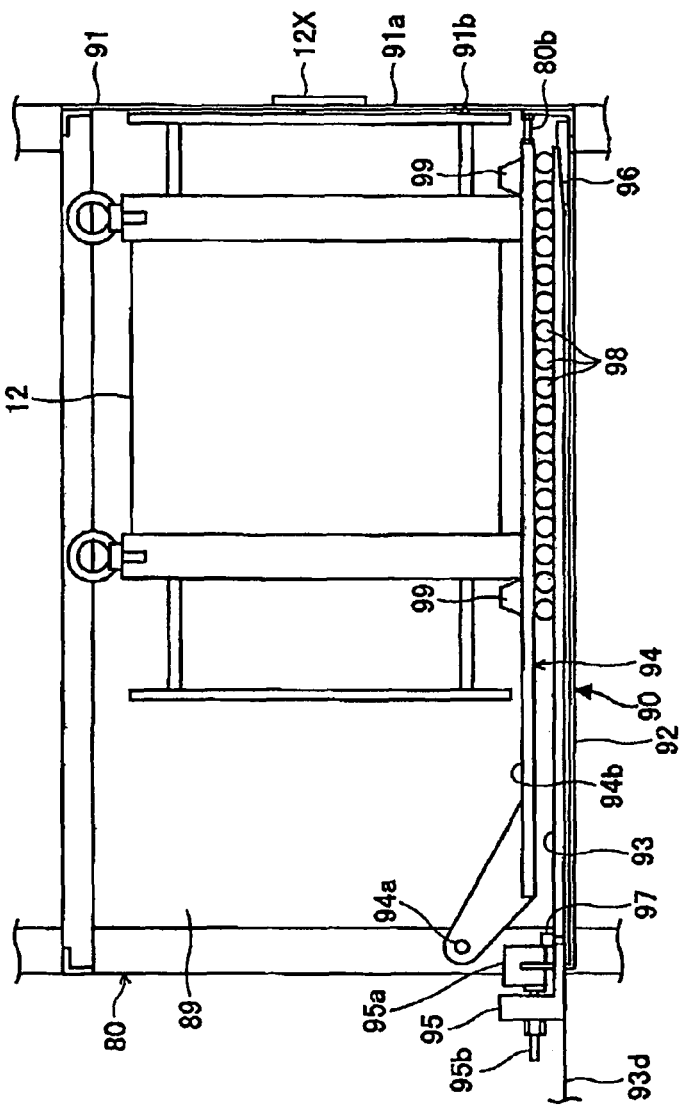
FIG. 7 is a side view schematically illustrating a lower supporting section of the induction heating apparatus shown in FIG. 6.
Figure 10A:
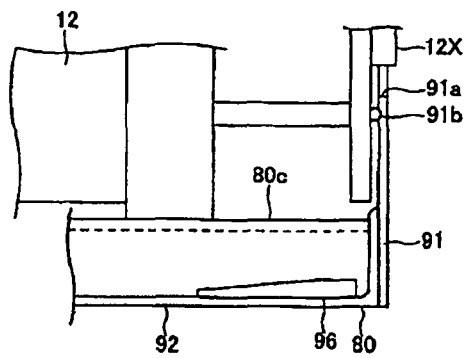
FIGS. 10A to 10C are partial side views illustrating the vicinities of the front ends of the carriage and the base plate in the induction heating apparatus shown in FIG. 6. More specifically.
Figure 10B:
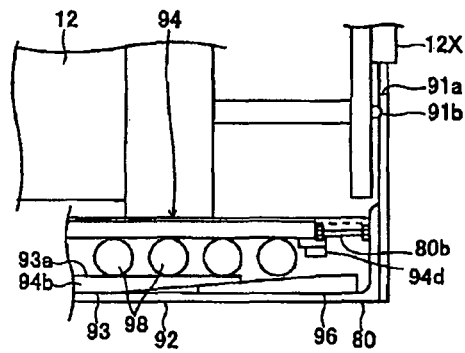
Figure 10C:
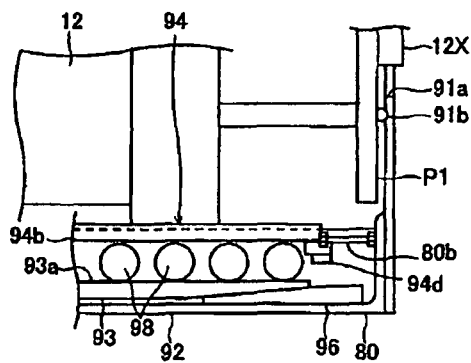

As shown in FIG. 7, in the lower supporting section 89, a replacing mechanism 90 for replacing the low-frequency current transformer 12 is constructed by assembling. This retrofitted replacing mechanism 90 includes a front-rear direction support 92 which is fixed to the mounting frame 80 and extends in a front-rear direction, a base plate 93 which is supported on the front-rear direction support 92 such that the base plate is displaceable in the front-rear direction, and a carriage 94 which is movable in the front-rear direction on the traveling surface of the top of the base plate 93. If the mounting frame 80 originally has no replacing mechanism, when the low-frequency current transformer 12 disposed on the mounting frame 80 as shown in FIG. 10A is replaced with another low-frequency current transformer, a worker inserts the base plate 93 between the low-frequency current transformer 12 and the front-rear direction support 92, so as to displace the base plate 93 to the front side. Then, the base plate 93 runs on an inclined member 96 attached to the front side of the mounting frame 80 in front such that the base plate 93 slightly rises (FIG. 10B). As will be described below, the worker raises the rear end of a carriage plate 94*b* by a vertical displacement means 97 so as to level the carriage plate 94*b*, thereby supporting the low-frequency current transformer 12 by the carriage plate 94*b*, with a gap from the mounting frame 80 (FIG. 10C), and then slides the low-frequency current transformer 12 together with the carriage 94 to the rear side.

Figure 9:
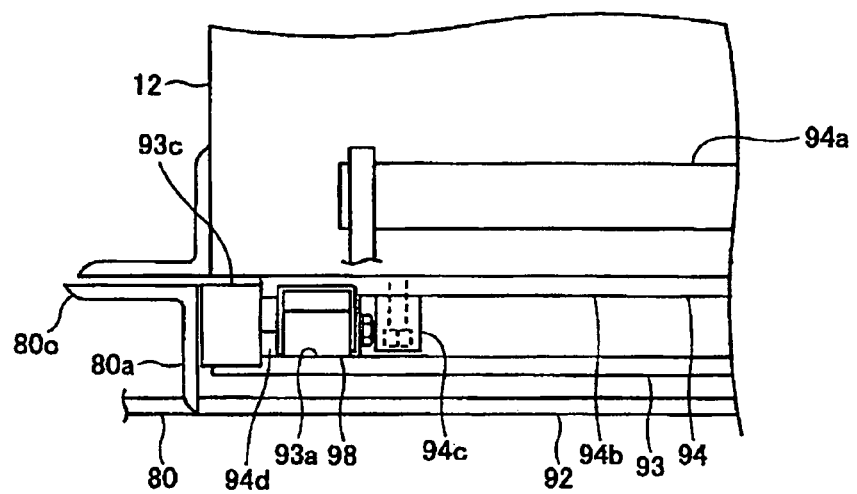
FIG. 9 is a partial rear view illustrating the vicinities of the rear ends of the carriage and the base plate in the induction heating apparatus shown in FIG. 6.

The front-rear direction support 92 may be a portion of the mounting frame 80, or may be a member like a plate fixed to the mounting frame 80. The front-rear direction support 92 is configured to stably support the base plate 93 with sufficient strength to support the low-frequency current transformer 12. The base plate 93 has strength capable of supporting the low-frequency current transformer 12, and has a traveling surface 93a for the carriage 94 on the top as shown in FIGS. 8A to 9. At the left and right edges of the top surface of the base plate 93, base ribs 93c are provided to extend substantially in parallel to each other in the front-rear direction. The provision of the base ribs 93c makes it possible to secure the strength of the base plate 93 and thin the base plate 93.

As shown in FIGS. 8A to 9, a pair of side edge guide units 80a is fixed to the mounting frame 80 to extend in the front-rear direction along the left and right edges of the base plate 93. If the mounting frame originally has no replacing mechanism, the low-frequency current transformer 12 is supported by the pair of side edge guide units 80a. The base plate 93 is disposed between the pair of side edge guide units 80a and is mounted on the front-rear direction support 92. The outer surfaces of the left and right base ribs 93c are slidable toward the inner surfaces of the side edge guide units 80a, respectively. Therefore, the base ribs 93c can be guided by the side edge guide units 80a such that the base plate 93 is displaced in the front-rear direction. Although not particularly limited, the base plate 93 are preferably disposed horizontally.

On the left and right sides of the rear end side of the base plate 93, front displacement means 95 are provided to connect the base plate 93 and the mounting frame 80 and make the base plate 93 displaceable back and forth with respect to the mounting frame 80. The front displacement means 95 include fixed blocks 95a that are fixed to the mounting frame at the left and right of the rear end side of the base plate 93, base protrusion portions 93b that are disposed to protrude left and right from the rear end of the base plate 93 and face the rear sides of the fixed blocks 95a, and pushing screw portions 95b that are fixed to the fixed blocks 95a through the base protrusion portions 93b. In the front displacement means 95, it is possible to rotate screwing members 95c of the pushing screw portions 95b to press the base protrusion portions 93b, thereby advancing the base plate 93.

At a position of the mounting frame 80 corresponding to the front end side of the base plate 93, as shown in FIG. 10, the inclined member 96 is provided and fixed on the front-rear direction support 92. The inclined member 96 has a gradient such that its front side is higher. As the inclined member 96, a wedge-shaped plate extending over the full width of the lower supporting section 89 in the left-right direction is used. If the base plate 93 is advanced by the front displacement means 95, the front end side of the base plate 93 can run on the inclined member 96, and it is possible to raise the front end side of the base plate 93 with respect to the front-rear direction support 92 according to the amount of advance.

As shown in FIGS. 7 to 8B, the vertical displacement means 97 is provided on the rear end side of the base plate 93, and is used to vertically displace the rear end side of the base plate 93 with respect to the mounting frame 80. For example, the vertical displacement means 97 is composed of a plurality of screw members screwed to the rear end side of the base plate 93. Each screw member can be screwed in the base plate to raise the base plate 93 from the front-rear direction support 92 of the mounting frame 80.

As shown in FIGS. 7 to 9, the carriage 94 includes the plate-like carriage plate 94b, a plurality of left rollers 98 and a plurality of right rollers 98 that are arranged in lines in the front-rear direction on the left and right edge sides of the lower surface of the carriage plate 94b, respectively, and can roll, and a handle 94a that is fixed on the rear end side of the carriage plate 94b such that the handle protrudes from the top surface of the carriage plate. On the lower surface of the carriage plate 94b, a pair of carriage ribs 94c is provided to extend in the front-rear direction along the lines of the left and right rollers 98. Therefore, it is possible to secure the strength of the carriage plate 94b and to thin the carriage plate 94b. On each side of the carriage 94, at least three or more rollers 98, preferably, further more rollers 98 are arranged in parallel to one another. Since many rollers 98 are disposed, it is possible to dispersively load the weight of the low-frequency current transformer 12 on the individual rollers 98. To the carriage 94, each member is fixed by bolts or screws, not by welding. Therefore, it is possible to prevent deformations of the carriage 94 and to stably operate the carriage 94 in a small space.

The carriage plate 94b is formed in a flat plate shape, and on the front end sides and rear end sides of the left and right of the carriage plate 94b, cam followers 94d are disposed to abut on the inner surface of the left and right base ribs 93c and roll thereon. While the plurality of rollers 98 rolls on the traveling surface 93a of the base plate 93, the cam followers 94d abut on the inner surfaces of the base ribs 93c and roll thereon. Therefore, the carriage 94 is movable back and forth along the base ribs 93c on the base plate 93.

It is preferable that it is possible to attach a jig 99 for locking the front end edge of the low-frequency current transformer 12 and a jig 99 for locking the rear end edge of the low-frequency current transformer 12 to the top surface of the carriage plate 94b, as shown in FIGS. 8A and 8B. The jigs 99 locate the low-frequency current transformer 12 at a predetermined position on the carriage plate 94b. The jigs 99 are formed in rod shapes, and are fixed to extend in the width direction of the carriage 94. On the side surfaces of the jigs 99, guide surfaces 99a are provided to guide the front end edge or rear end edge of the low-frequency current transformer 12 when the low-frequency current transformer 12 is placed on the carriage plate 94b.

At each of a plurality of positions of the carriage plate 94b, a plurality of fixing positions for the jigs 99 is provided. Therefore, it is possible to select fixing positions and fix the jigs 99, thereby capable of using the jigs for a plurality of low-frequency current transformers 12 different in length in the front-rear direction. The jigs 99 are fixed to the top surface of the carriage 94 by jig fixing screws 99b, respectively. The jig fixing screw 99b of each jig 99 can be eccentrically disposed on one side with respect to the center of the width direction of the corresponding jig 99, be reversed in the front-rear direction, and be fixed, whereby it is possible to change the guide surface 99a of each jig 99 between two positions. Therefore, it is possible to use the same jigs 99 to locate low-frequency current transformers 12 different in length in the front-rear direction, on the carriage 94.

The carriage 94 with the low-frequency current transformer 12 located thereon can advance, thereby disposing the low-frequency current transformer 12 at the connection position P1 with the heating coil 13, and can retreat, thereby disposing the low-frequency current transformer 12 at a replacement position P2.

As shown in FIGS. 10A and 10B, at a position of the mounting frame 80 facing the front edge of the carriage 94, a carriage stopper 80*b* is provided to abut on the carriage 94. The amount of protrusion of the carriage stopper 80*b* can be adjusted to adjust the contact position with the carriage 94 and accurately dispose the low-frequency current transformer 12 at the connection position.

The cover member 91 provided on the front side of the lower supporting section 89 has a size to cover the front side of the lower supporting section 89, and is disposed such that the front end surface of the low-frequency current transformer 12 disposed at the connection position P1 can abut on and be attached firmly to the cover member. At the center of the cover member 91, a connection opening 91*a* is formed to allow the connector 87 of the low-frequency current transformer 12 to be disposed therein. Around the connection opening 91*a*, an endless packing 91*b* is disposed to surround the connection opening 91*a*. If the low-frequency current transformer 12 is disposed at the connection position P1, the periphery of the connector 87 of the low-frequency current transformer 12 is attached firmly to the packing 91*b*. Due to the packing 91*b*, when the quenching liquid is injected at the heating position, it is possible to surely prevent the quenching liquid from penetrating into the cover member. The crushing margin of the packing 91*b* can be adjusted by adjusting the contact position of the carriage stopper 80*b*.

Now, a case of replacing a low-frequency current transformer 12A, mounted on a mounting frame 80 having no replacing mechanism as shown in FIG. 6, with another low-frequency current transformer 12B will be described.

In the mounting frame 80 having no replacing mechanism, as shown in FIG. 6, the primary-side bus bar 83 is connected to the connector 86 of the rear side of the low-frequency current transformer 12A, and the secondary-side bus bar 82 is connected to the connector 87 of the front side of the low-frequency current transformer 12A, and the heating coil 13 is connected to the secondary-side bus bar 82. The secondary winding of the high-frequency current transformer 11 and the secondary winding of the low-frequency current transformer 12A are connected in parallel with respect to the heating coil 13. The primary-side bus bar 83, the secondary-side bus bar 82, and the liquid paths of the primary winding and secondary winding of the low-frequency current transformer 12A are connected to the cooling liquid system by the couplers. Under this situation, the low-frequency current transformer 12A and the primary-side bus bar 83 are disconnected, and the low-frequency current transformer 12A and the secondary-side bus bar 82 are disconnected, and the couplers of the cooling liquid paths are removed.

In this way, the low-frequency current transformer 12A is ready to be replaced. First, as shown in FIG. 10A, on the front left and right end sides of the front-rear direction support 92, near to the cover member 91, the inclined member 96 is disposed to get higher from the rear to the front. In this case, as shown in FIG. 10A, the low-frequency current transformer 12B is supported by the angles of the mounting frame 80, specifically, the angles of carrying supports 80*c* of the upper ends of the side edge guide units 80*a*.

Next, the base plate 93 is inserted between the low-frequency current transformer 12A and the front-rear direction support 92, and the carriage 94 is driven on the base plate 93 such that the carriage 94 is inserted between the low-frequency current transformer 12A and the base plate 93 until the carriage stopper 80*b* abuts on the mounting frame 80. In this state, between the low-frequency current transformer 12A and the carriage 94, a gap still exists.

Next, the front displacement means 95 are disposed on the left and right sides of the rear end side of the base plate 93, and are connected to the base plate 93 and the mounting frame 80. The screwing members 95*c* of the front displacement means 95 are rotated to displace the base plate 93 fourth, such that the forward small force causes an upward large force by wedge effect according to the inclination of the inclined member 96. In this way, the base plate 93 is displaced forward to run on the inclined member 96 attached to the front side of the mounting frame 80 in front, such that the base plate 93 slightly rises.

Next, the vertical displacement means 97 raises the rear end of the carriage plate 94*b* so as to level the carriage plate 94*b*, thereby supporting the low-frequency current transformer 12 by the carriage plate 94*b* with a gap from the mounting frame 80 (FIG. 10C), and then the low-frequency current transformer 12 is slid together with the carriage 94 to the rear side. In this case, since an extension plate 93*d* is disposed to be smoothly connected to the top surface of the base plate 93 on the rear side of the base plate 93, the low-frequency current transformer 12A is moved together with the carriage 94 to the replacement position P2 where the low-frequency current transformer 12A does not vertically overlap the high-frequency current transformer 11, and is taken out. Next, in a state where the carriage 94 is still at the replacement position P2, the low-frequency current transformer 12A is unloaded from the carriage 94, for example, by a crane (not shown).

Next, another low-frequency current transformer 12B is mounted on the carriage plate 94*b*, for example, by the crane (not shown), and the carriage 94 is advanced on the base plate 93. The front end of the carriage plate 94*b* is made to about on the carriage stopper 80*b*, such that the carriage 94 stops. In this way, it is possible to perform positioning in the front-rear direction such that the low-frequency current transformer 12 is disposed at the connection position P1.

Next, in order to fix the carriage 94, the carriage 94 is fixed to the base plate 93 by a fixing member 94*e* as shown in FIGS. 8A and 8B.

Here, the connector 86 of the rear side of the low-frequency current transformer 12B and the connector 87 of the front side of the low-frequency current transformer 12B are disposed at positions slightly higher than those of the primary-side bus bar 83 and the secondary-side bus bar 82 before the replacement of the low-frequency current transformer 12A. Therefore, mounting holes for the primary-side bus bar 83 and the secondary-side bus bar 82 may be expanded for position adjustment, and the primary-side bus bar and the secondary-side bus bar are connected to the mounting holes.

As described above, with the base plate 93, the inclined member 96, and the front displacement means 95 assembled together, it is possible to retrofit the replacing mechanism 90 to the mounting frame 80 by the base plate 93, the inclined member 96, the front displacement means 95, and the carriage 94.

After the retrofitting, in a case of replacing the low-frequency current transformer 12, the fixing member 94*e* is removed from the base plate 93, the carriage 94 on the base plate 93 is retreated, and the low-frequency current transformer is taken out.

Therefore, in a case of using a induction heating apparatus 10 to perform a quenching process on a workpiece, a heating coil 13 corresponding to the workpiece and an area to be quenched is selected, and a low-frequency current transformer 12 satisfying an impedance matching condition corresponding to the selected heating coil 13 is selected. Even if a high-frequency current transformer 11 is disposed on the upper supporting section 88 of the mounting frame 80 in advance, it is possible to dispose the selected low-frequency current transformer 12 at the lower supporting section 89.

Since the low-frequency current transformer 12 and the high-frequency current transformer 11 are disposed to vertically overlap each other as shown in FIG. 6, it is possible to reduce the disposition space. Further, since the low-frequency current transformer 12 has a core and has a weight larger than that of the high-frequency current transformer 11, if the low-frequency current transformer 12 is disposed below the high-frequency current transformer 11, it is possible to lower the center of the induction heating apparatus 10 and stably dispose the entire induction heating apparatus 10.

In the induction heating apparatus 10, the low-frequency current transformer 12 and the high-frequency current transformer 11 are connected in parallel to the heating coil 13, and the low-frequency current transformer 12 and the high-frequency current transformer 11 are connected to the power source system 20 through switches, respectively. Therefore, if the switches are appropriately switched, it is possible to implement various heating effects, and implement appropriate heating according to the heat treatment area of a workpiece.

Particularly, it is possible to select any one from the plurality of heating coils 13 having different impedances, and mount it on the secondary-side bus bar 82, and it is possible to select one low-frequency current transformer satisfying an impedance matching condition corresponding to a heating coil 13 from the plurality of low-frequency current transformers 12 different in the turn ratio of the primary winding and the secondary winding. Replacement of the low-frequency current transformer 12 makes it possible to satisfy an impedance matching condition corresponding to a heating coil 13 and efficiently implement various heating effects according to workpieces.

Here, the replacing mechanism 90 is not limited to each induction heating apparatus 10 of the induction heating system 1 shown in FIG. 1, but can be used even in the following case. For example, even in an induction heating apparatus 10 with one current transformer, in a case where there is another member disposed on the current transformer, and thus detachment or attachment of the current transformer from above is impossible, if the replacing mechanism 90 as described above is provided, it is possible to easily perform attachment and detachment of the current transformer. If the current transformer is broken down, it is possible to take out the current transformer from the mounting frame 80 and fix the current transformer.

In the induction heating system 1 shown in FIG. 1, the single power source system 20 supplies electric power to the plurality of induction heating apparatuses 10. Therefore, from the power source system 20 to the induction heating apparatuses 10, specifically, to the high-frequency input switches 33 and the low-frequency input switches 34 attached to the induction heating apparatuses 10, the bus bars are used for power supply. Since a single power source system 20 is not provided for each induction heating apparatus 10, it is impossible to reduce the distances between the individual induction heating apparatuses 10 and the single power source system 20. For this reason, the bus bars are provided to ensure the distances. On the other hand, in the induction heating system 1 according to the embodiment of the present invention, the single power source system 20 is used to supply a large amount of electric power with a high voltage of an order of several thousands volts. Those points should be considered with respect to a way to dispose the bus bars. Hereinafter, they will be described sequentially.

High-Frequency Power Supply Path and Low-Frequency Power Supply Path

Figure 11A:
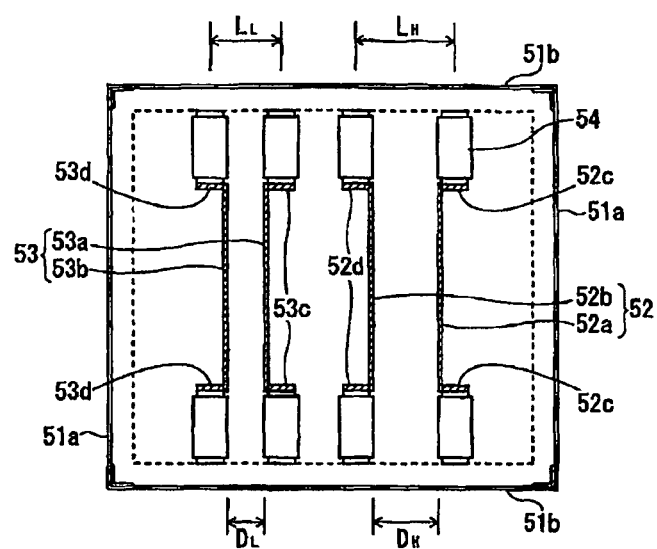
FIGS. 11A and 11B are a cross-sectional view and a plan view illustrating a status where a high-frequency power supply path and a low-frequency power supply path are disposed on the frame of a duct, respectively.
Figure 11B:
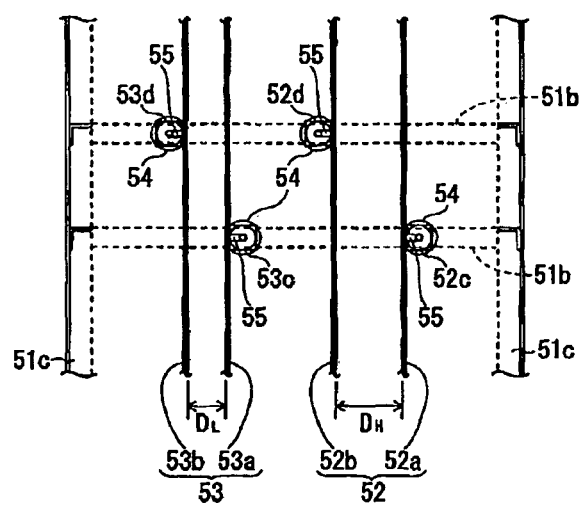

A high-frequency power supply path and a low-frequency power supply path are disposed in a duct of a case accommodating matching boxes, switches, current transformers, and the like. FIGS. 11A and 11B are a cross-sectional view and a plan view illustrating a status where the high-frequency power supply path and the low-frequency power supply path are disposed in the frame of a duct, respectively. A duct frame 51 is composed of vertical frames 51a, horizontal frames 51b, and a depth frame 51c such that the duct frame has a rectangular shape in a cross-sectional view and extends in a depth direction. Inside the frame, one bus bar 52a and another bus bar 52b are disposed with a gap, whereby a high-frequency power supply path 52 is provided, and one bus bar 53a and another bus bar 53b are disposed with a gap, whereby a low-frequency power supply path 53 is provided.

As described above, since electric power is supplied to the plurality of induction heating apparatuses 10 by the single power source system 20, the distances from the power source system 20 to the individual induction heating apparatuses 10 lengthen. Therefore, the impedances of the pairs of bus bars increase. Then, in a circuit configured by connecting the power source system 20, the current transformers 11 and 12, and the heating coils 13, it becomes possible to ignore the influence of the impedances of the bus bars, and a resonant frequency drops. Particularly, if electric power of a high frequency of about 200 kHz is supplied, reactance increases, and voltage drops in the power supply paths increase.

For this reason, in the embodiment of the present invention, in order to make the impedances of the power transmission bus bars as small as possible, the widths of the bus bars are set to be large, and the gap between the bus bars 52a and 52b and the gap between the bus bars 53a and 53b are set to be as small as possible.

As shown in FIGS. 11A and 11B, between the pair of left and right vertical frames 51a, the pair of bus bars 52a and 52b for high-frequency power transmission and the pair of bus bars 53a and 53b for low-frequency power transmission are arranged side by side. In this case, in a plan view, the gap $L_H$ between the bus bars 52a and 52b for high-frequency power transmission is set to be larger than the gap $L_L$ between the bus bars for low-frequency power transmission. For example, the gap $L_H$ is set to 60 mm to 100 mm, and the gap $L_L$ is set to 10 mm to 50 mm. The reason why the gap $L_H$ is set to be larger than the gap $L_L$ is that the voltage of the high frequency is higher than the voltage of the low frequency. At the upper and lower portions of the power transmission bus bars, there are hooks 52c, 52d, 53c, and 53d for mounting called ears. The hooks 52c, 52d, 53c, and 53d for mounting provided at the upper and lower portions of the power transmission bus bars 52a, 52b, 53a, and 53b are fixed to the vertical frames 51a with insulators interposed therebetween. Each power transmission bus bar 52a, 52b, 53a, or 53b have the hooks 52c, 52d, 53c, or 53d for mounting provided with a gap in the longitudinal direction, that is, the disposition direction.

If the gap $L_H$ between the power transmission bus bars 52a and 52b and the gap $L_L$ between the power transmission bus bars 53a and 53b are set to be large, the gap between the bus bar 52b for high-frequency power transmission and the bus bar 53a for low-frequency power transmission narrows. Further, since a high voltage of several thousands volts is applied to all of the power transmission bus bars 52a, 52b, 53a, and 53b, there is a possibility that insulation breakdown will occur. For this reason, the pair of the bus bars 52a and 52b for high-frequency power transmission and the pair of the bus bars 53a and 53b for low-frequency power transmission are provided such that the hooks 52d and 53c of the bus bars 52b and 53a facing each other deviate from each other.

Further, all of the power transmission bus bars 52a, 52b, 53a, and 53b are fixed to the horizontal frames 51b with insulators 54 interposed therebetween. The horizontal frames 51b have elongated holes 55 formed along the horizontal frames 51b, respectively, and the elongated holes 55 make it possible to adjust the horizontal frames 51b, the insulators 54, and the gaps among the power transmission bus bars 52a, 52b, 53a, and 53b.

Switch

In the induction heating system shown in FIG. 1, as switches, the output switch 31 for the first power source, the output switch 32 for the second power source, the high-frequency input switches 33, and the low-frequency input switches 34 are provided. These switches have almost the same configuration. FIGS. 12A and 12B are a plan view and a front view illustrating the configuration of each switch in the induction heating system shown in FIG. 1, respectively.

In a switch 60, an upstream bus bar mounting portion 61a and a downstream bus bar mounting portion 61b of one phase of two phases, for example, an U phase and a V phase are provided to face each other and stand on a base plate 63, and an upstream bus bar mounting portion 62a and a downstream bus bar mounting portion 62b of the other phase are provided to face each other and stand on a base plate 63. The upstream bus bar mounting portions 61a and 62a and the downstream bus bar mounting portions 61b and 62b have cooling flow paths (not shown) formed therein and connected to a cooling water inlet 64a and a cooling water outlet 64b provided at the lower surface of the base plate 63.

In order to prevent insulation breakdown between the upstream and down bus bar mounting portions 61a and 61b and between the upstream and downstream bus bar mounting portions 62a and 62b, in the base plate 63, between the upstream and down bus bar mounting portions 61a and 61b and between the upstream and downstream bus bar mounting portions 62a and 62b, elongated holes 63a and 63b are formed, respectively, such that creepage distances are set to be long. Further, in order to prevent insulation breakdown between the downstream bus bar mounting portion 61b of the one phase and the upstream bus bar mounting portion 62a of the other phase, in the base plate 63, between the upstream bus bar mounting portion 62a and the downstream bus bar mounting portion 61b, a elongated hole 63c is formed to set a creepage distance to be long.

As described above, at each phase, the upstream bus bar mounting portion 61a or 62a and the downstream bus bar mounting portion 61b or 62b are provided to stand on the base plate 63 with the gap. Each of connection blocks 65 abuts on the end surfaces of two of the bus bar mounting portions 61a, 61b, 62a, and 62b such that both bus bar mounting portions are electrically connected, whereby switching is performed. To this end, one connection block 65 is provided for each phase. As shown in FIGS. 12A and 12B, each connection block 65 includes a contact portion 65a for electrically connecting the upstream bus bar mounting portion 61a or 62a and the downstream bus bar mounting portion 61b or 62b, a support 65b for supporting the contact portion 65a to be rotatable on a vertical shaft, and a rod 65c that extends from the support 65b toward the opposite side to the contact portion 65a. On the base plate 63, at a position on the opposite side of the connection blocks 65 to the upstream bus bar mounting portions 61a and 62a and the downstream bus bar mounting portions 61b and 62b, a support block 66 is disposed to be able to be displaced to the left and right by an air cylinder 67. The rods 65c of the connection blocks 65 of the individual phases pass through one support block 66, and compression springs 68 are mounted on the rods 65c and bias the connection block 65. As shown in FIGS. 12A and 12B, each connection block 65 rotates on a vertical shaft within a predetermined range. Therefore, if the support block 66 is displaced to one side by the air cylinder 67, according to the displacement, the individual connection blocks 65 are displaced to one side, and are surely pressed against the end surfaces of the upstream and downstream bus bar mounting portion 61a and 61b and the end surfaces of the upstream and downstream bus bar mounting portion 62a and 62b by compression springs 68.

Also, on the base plate 63, cooling pipes 69 for introducing the cooling water to the connection blocks 65 and discharging the cooling water from the connection blocks 65, a solenoid valve 70 for controlling injection and discharge of air with respect to the air cylinder 67, and a limit switch 71 for confirming the advance end and retreat end of the air cylinder 67 are provided.

On the lower surface of the base plate 63, a plurality of insulators 72 is attached such that the switch 60 is electrically insulated. The connection blocks 65, the upstream bus bar mounting portions 61a and 62a, and the downstream bus bar mounting portions 61b and 62b are water-cooled by the cooling water. To this end, various detecting sensors are attached to detect whether the flow of the cooling water has exceed a defined value, or to detect an anomaly in the air cylinder or the pipe necessary for the air cylinder. If an anomaly of air pressure or an anomaly of the flow of the cooling water is detected by a detecting sensor, the switch 60 sends an air pressure anomaly signal or a cooling water flow anomaly signal to the switching controller 35. Then, the switching controller 35 commands each induction heating apparatus and the power source system not to perform a system operation.

Method of Sequentially Heating Multiple Workpieces by Induction Heating System

While describing a method of sequentially heating workpieces by each induction heating apparatus 10 in the induction heating system 1 shown in FIG. 1, the induction heating system will be described in detail.

Figure 13:
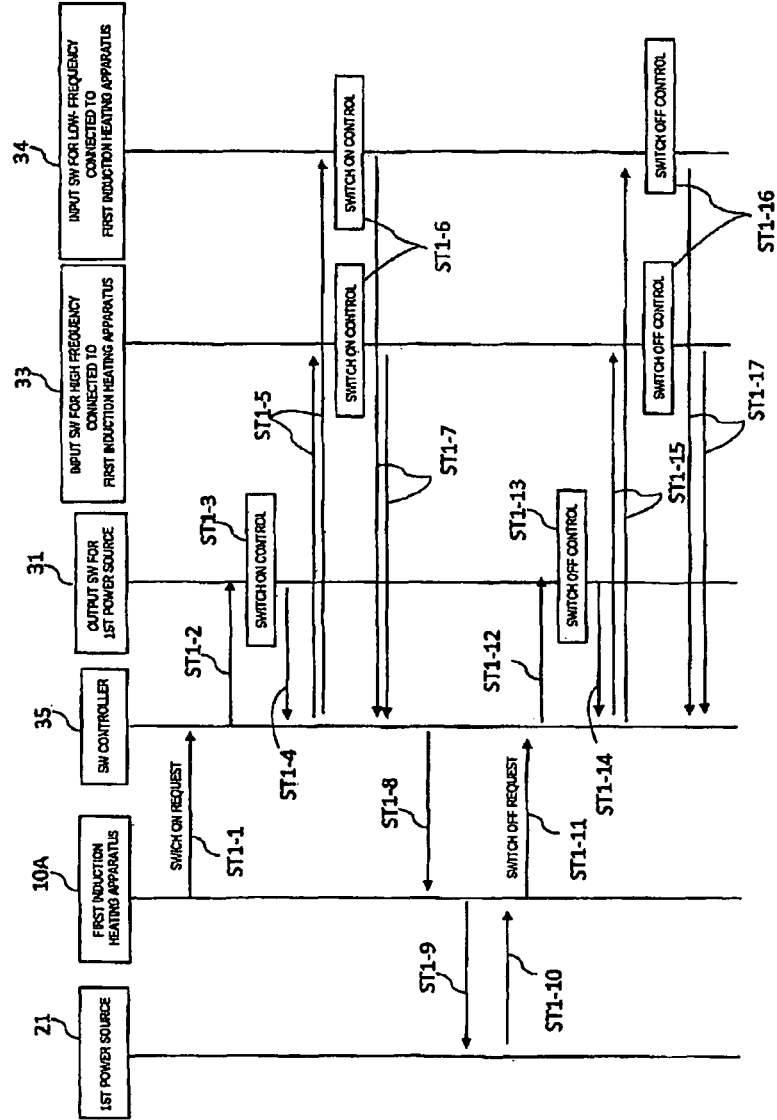
FIG. 13 is a view illustrating a sequence in which each induction heating apparatus performs induction heating on a workpiece by the induction heating system of FIG. 1, and shows a case where a first induction heating apparatus receives power supply from the first power source by a time-division method, and performs induction heating.

FIG. 13 is a view illustrating a sequence in which each induction heating apparatus 10 performs induction heating on a workpiece by the induction heating system 1 shown in FIG. 1, and particularly shows a case where the first induction heating apparatus 10A receives electric power from the first power source 21 by the time-division method, and performs a heat treatment.

In ST1-1, the first induction heating apparatus 10A sends an OFF-to-ON switching request signal to the switching controller 35.

In ST1-2, upon receipt of the OFF-to-ON switching request signal, the switching controller 35 sends an OFF-to-ON switching request signal to the output switch 31 for the first power source.

In ST1-3, upon receipt of the OFF-to-ON switching request signal, the output switch 31 for the first power source performs an OFF-to-ON switching control.

In ST1-4, when the OFF-to-ON switching control is completed, the output switch 31 for the first power source sends a switching completion signal to the switching controller 35.

In ST1-5, upon receipt of the OFF-to-ON switching request signal, the switching controller 35 sends an OFF-to-ON switching request signal to the high-frequency input switch 33 and the low-frequency input switch 34 connected to the first induction heating apparatus 10A.

In ST1-6, upon receipt of the OFF-to-ON switching request signal, the high-frequency input switch 33 and the low-frequency input switch 34 connected to the first induction heating apparatus 10A perform OFF-to-ON switching controls.

In ST1-7, the high-frequency input switch 33 and the low-frequency input switch 34 connected to the first induction heating apparatus 10A send switching completion signals to the switching controller 35.

In ST1-8, upon receipt of the OFF-to-ON switching completion signals from the output switch 31 for the first power source, and the high-frequency input switch 33 and the low-frequency input switch 34 connected to the first induction heating apparatus 10A, the switching controller 35 sends a switching completion signal to the first induction heating apparatus 10A.

In ST1-9, upon receipt of the switching completion signal in ST1-8, the first induction heating apparatus 10A sends an output start signal to the first power source 21.

Upon receipt of the output start signal in ST1-9, the first power source 21 supplies electric power to the first induction heating apparatus on the basis of output control information received together with the output start signal. Here, the output control information is output control information notified to the first power source 21, and examples of the items of the output control information include identification information on whether to all of the high frequency and the low frequency are output or only the high frequency is output, the output ratio of the high frequency and the low frequency, each output intensity, a frequency value in a case where frequency setting is possible, a total output time, etc.

In ST1-10, when the first power source 21 terminates the power supply based on the output control information, the first power source 21 sends a power supply termination signal to the first induction heating apparatus 10A.

In ST1-11, upon receipt of the power supply termination signal, the first induction heating apparatus 10A sends an ON-to-OFF switching request signal to the switching controller 35.

In ST1-12, Upon receipt of the ON-to-OFF switching request signal, the switching controller 35 sends an ON-to-OFF switching request signal to the output switch 31 for the first power source. Also, when the switching controller 35 receives the ON-to-OFF switching request signal, if there is a switching request signal having been input from another induction heating apparatus, for example, a second induction heating apparatus 10B, according to the request of the second induction heating apparatus 10B, the switching controller 35 switches one or more switches of the output switch 31 for the first power source, the output switch 32 for the second power source, and the high-frequency input switch 33 and the low-frequency input switch 34 of the second induction heating apparatus 10B. If there is no switching request signal having been received from another induction heating apparatus, the switching controller 35 maintains the switches at the current states.

In ST1-13, upon receipt of the first power source receives the ON-to-OFF switching request signal, the output switch 31 performs an ON-to-OFF switching control.

In ST1-14, when the ON-to-OFF switching control is completed, the output switch 31 for the first power source sends a switch completion signal to the switching controller 35.

In ST1-15, upon receipt of the ON-to-OFF switching request signal, the switching controller 35 sends an ON-to-OFF switching request signal to the high-frequency input switch 33 and the low-frequency input switch 34 connected to the first induction heating apparatus 10A.

In ST1-16, upon receipt of the ON-to-OFF switching request signal, the high-frequency input switch 33 and the low-frequency input switch 34 connected to the first induction heating apparatus 10A perform ON-to-OFF switching controls.

In ST1-17, when the switching is completed, the high-frequency input switch 33 and the low-frequency input switch 34 connected to the first induction heating apparatus 10A send a switching completion signals to the switching controller 35.

Here, ST1-2 and ST1-5 may be performed at the same time, or one after the other. ST1-12 and ST1-15 may be performed at the same time, or one after the other.

In the sequence shown in FIG. 13, once it receives a request for switching to the ON state from the first induction heating apparatus 10A, the switching controller 35 is maintained at a standby state even when it receives a signal for requesting switching to the ON state from another induction heating apparatus, until receiving a switching completion signal of switching from the ON state to the OFF state in ST1-17. Then, upon receipt of a switching completion signal of switching from the ON state to the OFF state in ST1-17, the switching controller 35 performs a process according to the switching request signal from another induction heating apparatus.

This sequence can be used for the single power source system 20 to handle switching requests from the plurality of induction heating apparatuses 10, without batting.

In the sequence described with reference to FIG. 13, a case of using a plurality of induction heating apparatuses to perform induction heating has been assumed. However, it is possible to repeat the heat treatment in only one induction heating apparatus using the system shown in FIG. 1. In this case, an output switch is maintained at a connection state with only the induction heating apparatus 10A. Therefore, it is possible to extend the life of the output switch. Also, whenever a switching request signal from another induction heating apparatus disappears, the switch may be switched off.

The sequence shown in FIG. 13 is an example, and can be changed as follows.

If the switching controller 35 receives the switching completion signals of the switching from the OFF state to the ON state, from the output switch 31 for the first power source, and the high-frequency input switch 33 and the low-frequency input switch 34 connected to the first induction heating apparatus 10A, the switching controller 35 sends the output start signal directly to the first power source 21, instead of STEPS ST1-8 and ST1-9 of FIG. 13. Upon receipt of the output start signal from the switching controller 35, the first power source 21 supplies electric power to the first induction heating apparatus 10A on the basis of the output control information received together with the output start signal. The items of the output control information are the same as described above.

If the first power source 21 terminates the power supply based on the output control information, instead of STEPS ST1-10 and ST1-11 of FIG. 13, the first power source 21 performs switching control to switch the output switch 31 for the first power source from the ON state to the OFF state in ST1-12, and the switching controller 35 sends the ON-to-OFF switching request signal to the high-frequency input switch 33 and the low-frequency input switch 34 connected to the first induction heating apparatus 10A in ST1-15.

In FIG. 13, the first induction heating apparatus 10A takes the initiative, and controls the first power source 21, the switching controller 35, the output switch 31 for the first power source, and the high-frequency input switch 33 and the low-frequency input switch 34 connected to the first induction heating apparatus. However, the sequence control of the induction heating system shown in FIG. 1 may be sequence control other than that shown in FIG. 13. For example, the switching ON request sent from the first induction heating apparatus 10A to the switching controller 35 may serve as a trigger and together with the switching request, the output control information may be output to the switching controller 35, and the switching controller 35 may control the first power source 21, the output switch 31 for the first power source, and the high-frequency input switch 33 and the low-frequency input switch 34 connected to the first induction heating apparatus. Like this, the switching controller 35 controls not only switching of each switch but also the first power source 21. For this reason, the switching controller 35 may be called the system control unit.

FIG. 14 shows a sequence in which each induction heating apparatus 10 performs induction heating on a workpiece by the induction heating system 1 shown in FIG. 1, and particularly shows a case where the first induction heating apparatus 10A receives power supply from the first power source 21 and the second power source 26 by the superimposing method, and performs a heat treatment. The sequence of FIG. 14 is different from the sequence of FIG. 13 in that, instead of the output switch 31 for the first power source, the output switch 32 for the second power source is controlled, and instead of STEPS ST1-9 and ST1-10, the following process is performed.

If the first induction heating apparatus 10A receives the switching completion signal in ST1-8, in ST2-9 replacing ST1-9, the first induction heating apparatus 10A sends output start signals to the first power source 21 and the second power source 26, respectively.

Upon receipt of the output start signals by ST2-9, the first power source 21 and the second power source 26 supply electric power to the first induction heating apparatus 10A on the basis of the output control information received together with the output start signals. Here, the output control information may include identification information representing that only the high frequency is output, an output intensity, a total output time, etc., as items which are notified to the first power source 21. Also, the output control information may include an output intensity, a frequency value in a case where frequency selecting is possible, a total output time, etc., as items which are notified to the second power source 26.

If the first power source 21 and the second power source 26 terminate the power supply on the basis of the output control information, in ST2-10 replacing ST1-10, the first power source 21 and the second power source 26 send power supply termination signals to the first induction heating apparatus 10A.

If the first induction heating apparatus 10A receives the power supply termination signals from the first power source 21 and the second power source 26, in ST1-11, the first induction heating apparatus 10A sends the ON-to-OFF switching request signal to the switching controller 35.

The sequence shown in FIG. 14 is an example, and can be variously changed, like the case of FIG. 13. If the switching controller 35 receives the switching completion signals of the switching from the OFF state to the ON state, from the output switch 32 for the second power source, and the high-frequency input switch 33 and the low-frequency input switch 34 connected to the first induction heating apparatus 10A, instead of STEPS ST1-8 and ST2-9 of FIG. 14, the switching controller 35 may send output start signals to the first power source 21 and the second power source 26, respectively. Upon receipt of the output start signals, the first power source 21 and the second power source 26 may supply electric power to the first induction heating apparatus 10A on the basis of the output control information received together with the output start signals. The items of the output control information are the same as described above.

If the first power source 21 and the second power source 26 terminate the power supply based on the output control information, instead of STEPS ST2-10 and ST1-11 of FIG. 14, the first power source 21 and the second power source 26 may send power supply termination signals to the switching controller 35. Then, in STEPS ST1-12 and ST1-15, the switching controller 35 sends the ON-to-OFF switching request signal, to the output switch 32 for the second power source, and the high-frequency input switch 33 and the low-frequency input switch 34 connected to the first induction heating apparatus 10A.

In FIG. 14, the first induction heating apparatus 10A takes the initiative, and controls the first power source 21, the second power source 26, the switching controller 35, the output switch 31 for the first power source, and the high-frequency input switch 33 and the low-frequency input switch 34 connected to the first induction heating apparatus. However, the sequence control of the induction heating system shown in FIG. 1 may be sequence control other than that shown in FIG. 14. For example, a switching ON request sent from the first induction heating apparatus 10A to the switching controller 35 may serve as a trigger, and together with the switching request, the output control information may be output to the switching controller 35, and the switching controller 35 may perform sequence control on the first power source 21, the second power source 26, the output switch 31 for the first power source, and the high-frequency input switch 33 and the low-frequency input switch 34 connected to the first induction heating apparatus. Like this, the switching controller 35 controls not only switching of each switch but also the first power source 21 and the second power source 26. For this reason, the switching controller 35 may be called the system control unit.

This sequence shown in FIG. 14 can be used for the single power source system 20 to handle switching requests from the plurality of induction heating apparatuses 10, without batting.

Like the sequence controls shown in FIGS. 13 and 14, the single power source system 20, that is, a power supply apparatus can be connected to one of the plurality of induction heating apparatuses 10, and supply electric power thereto. The reason is that the heater controller 14 and the switching controller 35 of each induction heating apparatus 10 shown in FIG. 1 have the following functions.

That is, the heater controller 14 requests the switching controller 35 a command to switch on one of the output switch 31 for the first power source and the output switch 32 for the second power source and to switch off the other, and a command to switch on or off each of the high-frequency input switch 33 and the low-frequency input switch 34.

If the switching controller 35 receives a command request from an induction heating apparatus 10, according to the command request, the switching controller 35 controls switching of the output switch 31 for the first power source, the output switch 32 for the second power source, and the high-frequency input switch 33 and the low-frequency input switch 34 connected to the induction heating apparatus 10 having output the command request. If the switching control is completed, the switching controller 35 outputs a switching completion signal to the corresponding induction heating apparatus 10. Then, upon receipt of the switching completion signal from the switching controller 35, the corresponding induction heating apparatus 10 controls the first power source 21 and the second power source 26 by the heater controller 14.

This merely shows one sequence control process, and may be changed as follows. In other words, if the switching controller 35 receives a command request from an induction heating apparatus 10, according to the command request, the switching controller 35 controls switching of the output switch 31 for the first power source, the output switch 32 for the second power source, and the high-frequency input switch 33 and the low-frequency input switch 34 connected to the induction heating apparatus 10 having output the command request. Then, if the switching control is completed, the switching controller 35 controls the output of at least one of the first power source 21 and the second power source 26 in accordance with the output control information received together with the command request from the corresponding induction heating apparatus 10.

In this way, according to the induction heating system 1 shown in FIG. 1, it is possible to perform various heat treatments by selecting one of the following four modes.

In a first mode, the induction heating apparatus receives supply of electric power of one frequency, that is, the high frequency from the first power source 21.

In a second mode, the induction heating apparatus receives supply of electric power from the second power source 26.

In a third mode, the induction heating apparatus receives supply of electric power of different frequencies from the first power source 21 by the time-division method.

In a fourth switching mode, the induction heating apparatus receives supply of electric power having one frequency from the first power source 21 and electric power from the second power source 26 in a superimposed manner.

Therefore, according to the induction heating system 1 shown in FIG. 1, it is possible to perform a heat treatment having the frequency effect.

Although the method of sequentially heating a plurality of workpieces by the induction heating system 1 has been described, the induction heating system 1 shown in FIG. 1 can also supply electric power from the power source system 20 to two or more induction heating apparatuses 10 which are electrically symmetric, at the same time. In this case, the switching controller 35 needs to switch on the high-frequency input switches 33 and the low-frequency input switches 34 connected to the induction heating apparatuses 10 to receive simultaneous power supply. Others may be appropriately changed on the basis of the sequences of FIGS. 13 and 14.

Also, the induction heating system 1 is very versatile, and can be used according to heat treatments on workpieces. For example, the induction heating system 1 can be used to perform quenching by an induction heating apparatus 10 and perform tempering by another induction heating apparatus 10.

Supply from One Power Source System to Multiple Induction Heating Apparatuses

FIG. 15 is a time chart illustrating how many induction heating apparatuses one power source system can supply electric power to. In FIG. 15, (a) shows a case of using two induction heating apparatuses, (b) shows a case of using three induction heating apparatuses, and (c) shows a case of using five induction heating apparatuses. A cycle time is denoted by τ. Also, the time chart is on the premise that one power source system 20 is used to perform the same heat treatment by a plurality of induction heating apparatuses 10. The time chart is applicable even to power supply of both of the superimposing method and the time-division method.

In FIG. 15, "SWITCHING" means a process of switching on or off the output switch 31 for the first power source, the output switch 32 for the second power source, the high-frequency input switches 33 and the low-frequency input switches 34 of each induction heating apparatus 10 in the induction heating system 1 shown in FIG. 1.

In FIG. 15, "HEATING" means a process of supplying electric power from the power source system, that is, from one or both of the first power source 21 and the second power source 26, to one of the induction heating apparatuses 10 and heating a workpiece by the heating coil 13 of the induction heating apparatus 10 in the induction heating system 1 shown in FIG. 1.

In FIG. 15, the term "COOLING" means a process of cooling the workpiece by spraying the quenching liquid or the cooling liquid onto the workpiece in the induction heating system 1 shown in FIG. 1.

In FIG. 15, the term "RELEASING & HOLDING" means a process of removing a workpiece having been subjected to an induction heating process, from a workpiece supporting means (not shown) and putting the next workpiece on the workpiece supporting means in the induction heating system 1 shown in FIG. 1.

Each induction heating apparatus 10 repeats a switching process, a heating process, a cooling process, and an attaching/detaching process in this order. A switching time, a heating time, a cooling time, and an attaching/detaching time are denoted by Ta, Tb, Tc, and Td, respectively. In a case of using n-number of induction heating apparatuses 10, the heating time and the cooling time are denoted by Tbn and Tcn, respectively. Also, the switching time Ta and the attaching/detaching time Td are set to values independent from the number of induction heating apparatuses. The cycle time τ and the individual times Ta, Tb, Tc, and Td have the following relation:

$$\tau = Ta + Tb + Tc + Td$$

In the induction heating system 1, in a case of using two induction heating apparatuses 10, as shown in (a) of FIG. 15, a switching process on the first induction heating apparatus 10A is performed, and then the first induction heating apparatus 10A performs a heating process. If the heating process terminates, another switching process starts, and the first induction heating apparatus 10A immediately starts a cooling process; whereas the second induction heating apparatus 10B waits for the completion of the another switching process and performs a heating process. If a cooling time Tc2 elapses from the start of the cooling process of the first induction heating apparatus 10A, the first induction heating apparatus 10A performs an attaching/detaching process, whereas the second induction heating apparatus 10B continues the heating process. If a heating time Tb2 elapses from the start of the heating process of the second induction heating apparatus 10B, another switching process is performed, and the second induction heating apparatus 10B immediately starts a cooling process; whereas the first induction heating apparatus 10A waits for the completion of the another switching process and performs another heating process. Then, the first induction heating apparatus 10A sequentially repeats the same processes; whereas the second induction heating apparatus 10B, if a cooling time Tc2 elapses, an attaching/detaching process is performed, and then the same processes are sequentially repeated.

Here, in a case of operating three induction heating apparatus 10 in the same cycle time τ in the induction heating system 1, since it is difficult to reduce the switching time Ta and the attaching/detaching time Td, as shown in (b) of FIG. 15, the heating time Tb and the cooling time Tc are set to be different from those in the case of using two induction heating apparatuses 10.

Further, in a case of operating n-number of induction heating apparatuses in the same cycle time τ in the induction heating system 1 (here, n is an integer of 2 or greater), as shown in (c) of FIG. 15, each of the heating time Tbn and the cooling time Tcn is obtained, and an induction heating condition according to the obtained heating time Tbn, and a cooling condition according to the cooling time Tcn are set.

As described above, in a case of using one power source system to operate a plurality of induction heating apparatuses 10 in the cycle time τ, a period during the power source system 20 can be connected to each induction heating apparatus 10 to supply electric power to the corresponding induction heating apparatus 10, that is, a heating time is obtained, and duty ratio, frequency selection, and electric power of each frequency, and the like are set so as to fulfill certain conditions in accordance with the heating time obtained for each induction heating apparatus 10.

Setting of Control from Induction Heating Apparatus

A method of setting heating conditions from each induction heating apparatus 10 to the system control unit including the switching controller 35 in the induction heating system 1 shown in FIG. 1 will be described.

FIGS. 16A to 16D are views illustrating examples of condition setting screens which are used in a case of setting heating conditions from each induction heating apparatus to the system control unit including the switching controller. More specifically, FIG. 16A shows an example of condition settings of steps, FIG. 16B shows a first set table of the time-division method, FIG. 16C shows a second set table of the time-division method, and FIG. 16D is a first set table of the superimposing method.

In the table shown in FIG. 16A, the first column represents the order of steps, and in the first row, an item 'STEP' represents the number of each step, an item 'TIMER' represents time, an item 'ROTATE' represents the rotation speed of a workpiece, an item 'HSWTABLE' represents the table reference destination information of the time-division method, an item 'HSW2VR' represents an output intensity, an item 'HSW2DT' represents the output ratio of the high frequency and the low frequency, an item 'BADTABLE' represents the table reference destination information of the superimposing method, an item '2BNDVR' represents the output intensity of the second power source 26, and an item '2BNDFREQ' represents information relative to the frequency of the second power source 26.

As shown in FIG. 16A, for each step, a time is set to the item 'TIMER', and the rotation speed of a workpiece is set to the item 'ROTATE'.

In a case of using the time-division method, information on a set table destination to be referred to in a case of performing table heating is set, and when step heating is performed, an output intensity VR, and the duty ratio DT of the low frequency are set as shown in FIG. 16A.

In a case of using the superimposing method, information on a set table destination to be referred to in a case of performing table heating is set, and when step heating is performed, an output intensity VR and a frequency are set. Here, setting a frequency means setting a frequency to be output on the premise on a case where it is possible to set a frequency to be output by the second power source 26.

Here, the step heating means a method in which a heat signal and heating conditions having the output intensity VR and the duty ratio DT of the low frequency as items are sent from each induction heating apparatus to the power source system 20 through the switching controller 35 for each step, and if each of the first power source 21 and the second power source 26 receives the heat signal and the heating conditions, the corresponding power source performs output control to heat a workpiece.

On the other hand, the table heating means a method in which tables as shown in FIGS. 16B to 16D are sent from each induction heating apparatus to the power source system 20 through the switching controller 35 in advance, and each of the first power source 21 and the second power source 26 performs output control according to the tables, so as to heat a workpiece.

If the step heating is used, in each step, a signal is sent from each induction heating apparatus to each power source to control start and termination of heating. Therefore, due to transmission and reception of the signal, an error occurs in the heating time. In contrast, if the table heating is used, a heating start signal and a heating termination signal are not sent or received with respect to each induction heating apparatus for each heating operation. Therefore, it is possible to accurately control the heating time. In the table heating, even in a case of changing the heating condition in time series within one table, it is possible to accurately control the heating time under each heating condition. In other words, if the table heating is used, since the heating condition is sent to each power source in advance, it is possible to increase the accuracy of the heating time, and even if the heating condition changes, it is possible to accurately perform output in the heating time of each heating condition.

In each step of FIG. 16A, if the item 'HSWTABLE' is 0, the first power source 21 does not perform the table heating, and if an item '2BNDTABLE' is 0, the first power source 21 and the second power source 26 do not perform the table heating. Meanwhile, if the item 'HSWTABLE' is 1, the first set table of the time-division method shown in FIG. 16B is referred to, and if the item 'HSWTABLE' is 2, the second set table of the time-division method shown in FIG. 16C is referred to, and if the item '2BNDTABLE' is 1, the first set table of the superimposing method shown in FIG. 16D is referred to.

In FIGS. 16B and 16C, reference symbols 'VR', 'DT', and 'HT' represent the output intensity, the duty ratio of the low frequency, and the heating time, respectively, and in FIG. 16D, reference symbols 'VR', 'FRQ', and 'HT' represent the output intensity, the output frequency, and the heating time, respectively.

In this way, a heating condition is set from each induction heating apparatus 10 to the system control unit including the switching controller 35.

Setting for Output Monitoring

Figure 17:
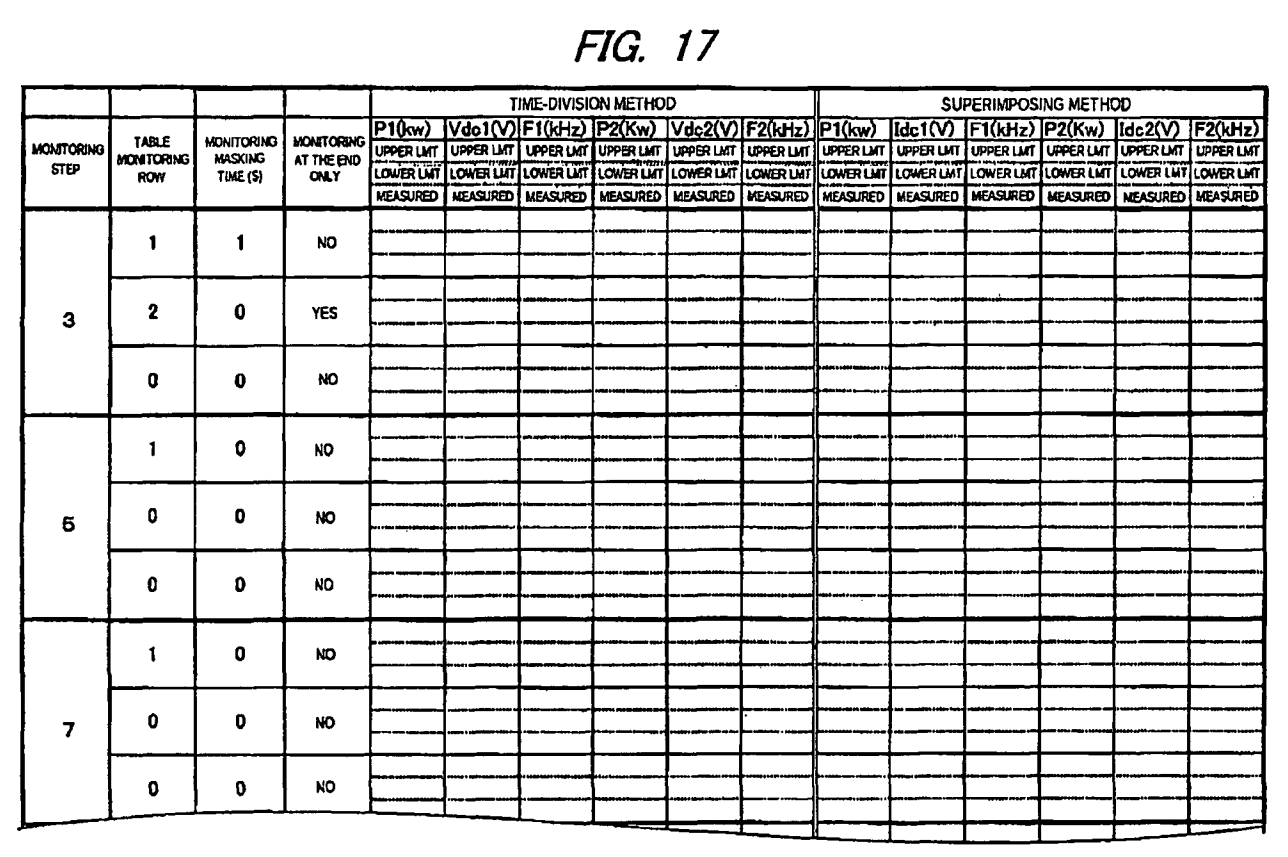

How to monitor output in a case of setting conditions like those in each table shown in FIGS. 16A to 16D will be described. FIG. 17 is a view illustrating an example of an output monitoring screen.

In FIGS. 16A to 16D, power supply is performed in STEP 3, STEP 5, and STEP 7. Therefore, output monitoring steps are denoted by 3, 5, and 7 which are the numbers of STEP 3, STEP 5, and STEP 7. In each of STEP 3, STEP 5, and STEP 7, an item 'TABLE MONITORING ROW' represents a row for monitoring in a table for reference. For example, in STEP 3, since the item 'HSWTABLE' is 1 in the table of FIG. 16A, the table of FIG. 16B is referred to, and a row for monitoring in the table of FIG. 16B is set to the item 'TABLE MONITORING ROW'. An item 'MONITORING MASKING TIME' means a time for which monitoring is not performed after heating starts, and if an item 'MONITORING AT THE END ONLY' is 'YES', monitoring is performed for a value at the end of the heating. In FIG. 17, for each of the time-division method and the superimposing method, electric power P1 and P2, the DC current Idc and the DC voltage Vdc which are input from the converter 21*a* or 26*a* to the inverter 21*b* or 26*b*, and frequencies F1 and F2 are set. With respect to each parameter, an upper limit and a lower limit are set, and a measured value is displayed.

However, the power source controllers 21*x* and 26*x* of the first power source 21 and the second power source 26 perform control such that the DC voltage becomes constant, or such that the DC current becomes constant. To this end, the output situation of each power source is monitored as a control object. In other words, each of the power source controllers 21*x* and 26*x* monitors the DC voltage Vdc for control to make the DC voltage constant, and monitors the DC current Idc for control to make the DC current constant.

Therefore, in the time-division method, the frequencies and any one of the DC voltage Vdc and the DC current Idc which are control objects are continuously monitored, and the value of electric power during heating termination is monitored. Meanwhile, in the superimposing method, the frequencies and any one of the DC voltage Vdc and the DC current Idc which are control objects are continuously monitored, and the value of electric power during heating termination is monitored. Also, in a case where the item 'MONITORING AT THE END ONLY' is 'YES' in FIG. 17, all values at the end of the heating operations are monitored.

Now, a monitoring method will be described.

In a case of using the table heating, there is a monitoring method as follows.

As a first process, on a monitoring screen as shown in FIG. 17, each value is set.

As a second process, a step of condition setting of which table heating will be monitored, and a row for monitoring of 15 rows of a table to be monitored are set. FIG. 17 shows a case where it is possible to set three rows as rows of table heating to be monitored.

As a third process, an inverter table operation measurement data device is always read, whereby a corresponding table row is monitored. Here, the inverter table operation measurement data device is a measuring unit to be described below. With respect to electric power, as will be described below, average electric power is monitored by reading a value during heating termination.

Also, even in a case of using the step heating, that is, even if the output intensity VR, the duty ratio DT of the low frequency, and the frequency of a step are input, each value is set on the monitoring screen, a step of condition setting of which step heating will be monitored is set, and the inverter table operation measurement data device is constantly read, thereby monitoring the DC voltage Vdc, the DC current Idc, electric power during heating termination, the frequency of the step set as a monitored object.

Equipment for Monitoring Electric Power

How to monitor electric power will be described in detail with reference to the circuits shown in FIGS. 3 and 4. As shown in FIGS. 3 and 4, the converter 21*a* and the inverter 21*b* are controlled by the inverter control units 21*c*, and the converter 26*a* and the inverter 26*b* are controlled by the inverter control unit 26*c*. Therefore, the DC current Idc and the DC voltage Vdc applied from the converter 21*a* to the inverter 21*b* or from the converter 26*a* to the inverter 26*b* are measured by a current sensor 101 and a voltage sensor 102 shown in FIGS. 3 and 4, and the measured values are input to a measuring section 103. The values input to the measuring section 103 are converted into digital values, which are output to a processing unit 104. The measuring section 103 is provided for each of the first power source 21 and the second power source 26, and the processing unit 104 is provided in each induction heating apparatus 10 or in a managing unit (not shown) for generally controlling the induction heating system 1.

There are various methods of monitoring electric power during operation of the induction heating system 1. Hereinafter, a case of supplying electric power according to a DT signal by the time-division method will be described.

Figure 18:
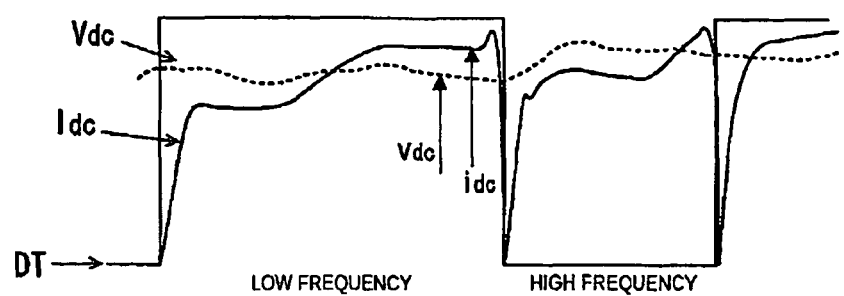
FIG. 18 is a view for explaining a first output monitoring method.

FIG. 18 is a view for explaining a first output monitoring method, and the vertical axis represents time, and the vertical axis represents the DC voltage Vdc, the DC current Idc, and the duty ratio DT of the low frequency. In a first output monitoring method, when the DT signal is in an ON state, that is, when the low frequency is being output, instantaneous values $v_{dc}$ and $i_{dc}$ are detected by the current sensor 101 and the voltage sensor 102. Therefore, low-frequency electric power and high-frequency electric power are obtained from the following equations.

The low-frequency electric power P1 (kW) is as follows:

$$P1 = v_{dc}(V) \times i_{dc}(A) \times DT(\%) \times 10^{-2} \times 10^{-3}$$

The high-frequency electric power P2 (kW) is as follows:

$$P2 = v_{dc}(V) \lambda i_{dc}(A) \times (100 - DT(\%)) \times 10^{-2} \times 10^{-3}$$

In the first output monitoring method, the instantaneous value $v_{dc}$ is relatively stable, and thus the DC current Idc changes at the duty ratio DT of the low frequency as time goes on. The reason is that in the time-division method, output is performed according to the control method of each power source, for example, such that the DC voltage becomes constant, and thus the current changes according to a change in load impedance. For this reason, accurate monitoring is impossible.

In the present invention, in a second monitoring method, for each predetermined interval Δt (for example, 0.5 ms), the instantaneous values $v_{dc}$ and $i_{dc}$ are detected by the current sensor 101 and the voltage sensor 102. Next, the product of the instantaneous values $v_{dc}$ and $i_{dc}$, that is, the products of the instantaneous values of the DC voltages and the DC currents at each sampling time are obtained, and are integrated for each of the low frequency and the high frequency for each step heating period, whereby electric power during step termination is obtained.

Figure 19:
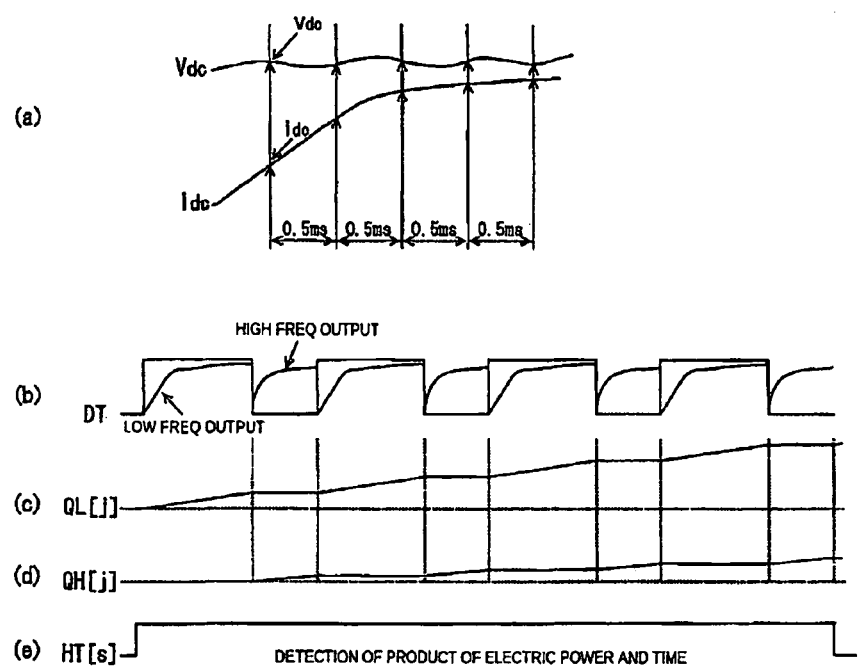
FIG. 19 is a view for explaining a second output monitoring method.

FIG. 19 is a view for explaining the second output monitoring method. In FIG. 19, (a) shows changes of the DC voltage and the DC current with time, and (b) to (e) show changes of the DT signal, integral low-frequency power consumption, integral high-frequency power consumption, and the heat signal with time, respectively.

As shown in (a) of FIG. 19, since the DC voltage and the DC current change as time goes on, at each sampling time, for example, at the intervals of 0.5 ms, instantaneous values are detected by the current sensor 101 and the voltage sensor 102. Then, for each sampling time, the integrated value q (J) of electric power with respect to time is obtained by the following equation.

$$q\ (\mathrm{J}) = v_{dc}\ (\mathrm{V}) \times i_{dc}\ (\mathrm{A}) \times [\text{SAMPLING TIME (s)}]A$$

Next, the sum QL (J) of the products of low-frequency electric power and time, and the sum QH (J) of the products of high-frequency electric power and time are obtained by the following equations, respectively.

$$QL\ (\mathrm{J}) = \Sigma q\ (\mathrm{J})\ (\text{Here, the integration is performed for a period when the } DT \text{ signal is at a high level (a low frequency output period)})$$

$$QH\ (\mathrm{J}) = \Sigma q\ (\mathrm{J})\ (\text{Here, the integration is performed for a period when the } DT \text{ signal is at a low level (a high frequency output period)})$$

Then, average low-frequency electric power P1 (kJ/s) and average high-frequency electric power P2 are obtained by the following equations. Here, HT (s) represents a total heating time.

$$P1\ (\mathrm{kJ/s = kW}) = QL\ (\mathrm{J}) / HT\ (\mathrm{s}) \times 10^{-3}$$

$$P2\ (\mathrm{kJ/s = kW}) = QH\ (\mathrm{J}) / HT\ (\mathrm{s}) \times 10^{-3}$$

Figure 20:
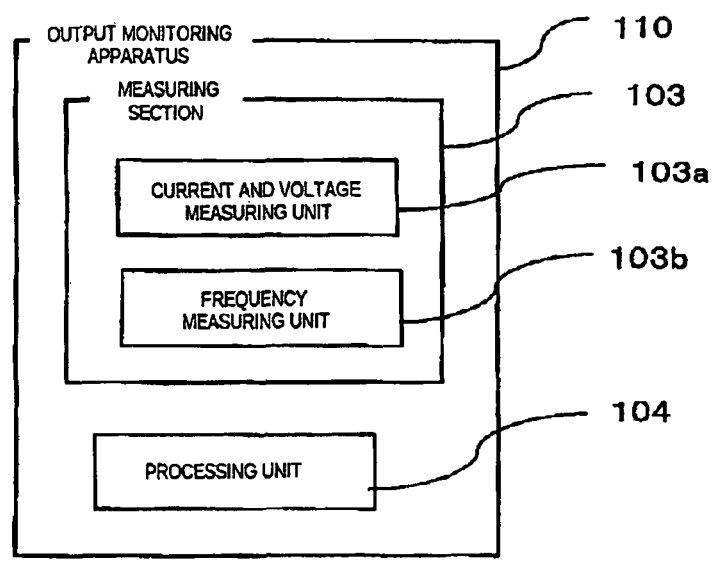
FIG. 20 is a block diagram illustrating the configuration of an output monitoring apparatus.

In the induction heating system 1 according to the embodiment of the present invention, an output monitoring apparatus 110 is connected to the first power source 21 and the second power source 26 of a power supply apparatus 120 serving the power source system shown in FIGS. 3 and 4, via wirings. FIG. 20 is a block diagram schematically illustrating an output monitoring apparatus 110. The output monitoring apparatus 110 includes the measuring section 103 and the processing unit 104.

The measuring section 103 measures the DC current Idc and the DC voltage Vdc which are output from the converter 21a to the inverter 21b or from the converter 26a to the inverter 26b shown in FIGS. 3 and 4, at each sampling time.

The processing unit 104 obtains an amount of electric power for each frequency from the values of the currents and the voltages measured at the individual sampling times by the measuring section 103, and obtains average electric power of each frequency on the basis of the amount of electric power of the corresponding frequency.

The power supply apparatus 120 is configured to be attached to the plurality of induction heating apparatuses 10 through the switching section 30, and be connectable to one of the induction heating apparatuses 10 by control of the plurality of induction heating apparatuses 10 on the switching section 30. In a case where the power supply apparatus 120 is configured like that, the processing unit 104 is provided to each of the plurality of induction heating apparatuses 10. Therefore, it is possible to acquire measurement data of the measuring section 103 with respect to the power supply apparatus 120, and each processing unit 104 determines the consistency of the average electric power of each frequency and a supply command having been issued to the power supply apparatus 120.

As shown in FIG. 20, the measuring section 103 includes a current and voltage measuring unit 103a and a frequency measuring unit 103b to corresponding to a method in which the power supply apparatus 120 supplies electric power in a time-division manner. In other words, the current and voltage measuring unit 103a measures the DC current and the DC voltage which are output from the converter 21a to the inverter 21b or from the converter 26a to the inverter 26b, from detection values which are input from the current sensor 101 and the voltage sensor 102 shown in FIGS. 3 and 4, at each sampling time. The frequency measuring unit 103b counts the number of times of switching made by the inverter 21b or 26b per unit time, thereby measuring the frequency of the output voltage or current.

Therefore, the processing unit 104 obtains an amount of electric power of each frequency obtained by the frequency measuring unit 103b, from the values of the current and the voltage measured at each sampling time by the current and voltage measuring unit 103a, and obtains the average electric power of the corresponding frequency on the basis of the amount of electric power of the corresponding frequency.

Output Monitoring Method

A method of monitoring output using the output monitoring apparatus 110 shown in FIG. 20 will be described.

As shown in FIG. 3, when a direct current is output while being switched on and off at a first frequency (for example, a low frequency) and a second frequency (for example, a high frequency) by the inverter 21b, first, the current and voltage measuring unit 103a measures the DC current and the DC voltage at each of sampling times, from detection data input from the current sensor 101 and the voltage sensor 102.

Next, when the inverter 21b switches on and off the direct current at the first frequency, the processing unit 104 receives the currents and the voltages measured at the individual sampling times by the current and voltage measuring unit 103a. The processing unit 104 adds the products of the input values, that is, the currents and the voltages of the individual sampling times, and divides the sum by the induction heating time which is the output time, thereby obtaining average output power of the first frequency. Also, when the inverter 21b switches on and off the direct current at the second frequency, the processing unit 104 receives the currents and the voltages measured at each of sampling times by the current and voltage measuring unit 103a. The processing unit 104 multiplies the input values, that is, the current and the voltage of each sampling time, adds the values of the individual sampling times obtained by the multiplication, and divides the sum by the induction heating time which is the output time, thereby obtaining average output power of the second frequency.

Next, the processing unit 104 may display the supplied electric power on a display unit (not shown) on the basis of the value of the average output power of the first frequency and the value of the average output power of the second frequency, thereby making a superintendent monitor the supplied electric power. It is monitored whether the average output power of each of the first frequency and the second frequency is between the upper limit and the lower limit set by the processing unit 104, and in a case where the average output power of each of the first frequency and the second frequency is out of the range between the upper limit and the lower limit, a stop signal is output to stop the output. Like this, in a case where a threshold value or an allowable range is set for each frequency, if the average output power of the corresponding frequency exceeds the threshold value or is out of the allowable range, it is possible to stop the output and remove any workpiece having not been subjected to appropriate induction heating.

As described above, the output monitoring apparatus 110 obtains average electric power of each frequency by sampling the DC voltage Vdc and the DC current Idc at predetermined intervals over the entire heating time. Therefore, it is possible to monitor changes such as rising of the output. In other words, it is possible to reduce the heating time, and to monitor even the transition state of rising of the output.

In the output monitoring method according to the embodiment of the present invention, the integral low-frequency power consumption is divided by the total heating time, whereby the average electric power of the low frequency is obtained, and the integral high-frequency power consumption is divided by the total heating time, whereby the average electric power of the high frequency is obtained.

Therefore, the processing unit 104 can monitor an anomaly of the DT signal designating switching between the first frequency and the second frequency, on the basis of changes in the magnitudes of the average electric power of the first frequency and the average electric power of the second frequency.

If an anomaly occurs in the DT signal to cause changes in the output times of the first frequency and the output times of the second frequency, integral electric power consumption of the output period of the first frequency and integral electric power consumption of the output period of the second frequency also change. As a result, the average electric power of each frequency obtained by dividing the integral electric power consumption of the corresponding frequency by the total output time also changes. Therefore, if it is monitored whether the values of the average electric power of the first frequency and the value of the average electric power of the second frequency change in time series, it is possible to monitor an anomaly of the so-called DT signal designating switching between the first frequency and the second frequency. Like this, if the average electric power of each frequency is monitored, it is possible to monitor even the DT signal.

Now, output monitoring in the case of using the superimposing method will be described. In the system shown in FIG. 1, the product of the DC voltage and the DC current is obtained for each of the first power source 21 and the second power source 26, and the integrated value of the products is divided by the total heating time, thereby obtaining average electric power. Then, it is possible to monitor the output in a way similar to that in the case of using the time-division method.

Modification of Output Monitoring Method

Figure 21:
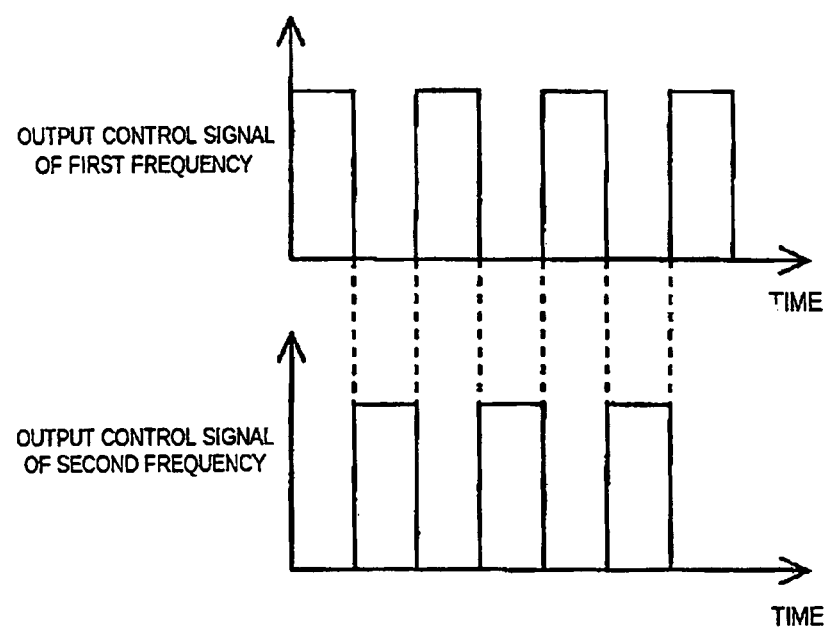
FIG. 21 is a view showing a case where electric power is supplied by the superimposing method and illustrating existence or non-existence of an output of a first frequency, and existence or non-existence of an output of a second frequency in time series.

The above-mentioned output monitoring method is for the case where electric power is supplied by the time-division method. However, this method can also be applied to a case where a low frequency and a high frequency are alternately output in a short time by the superimposing method. This will be described below in detail. FIG. 21 is a view illustrating existence or non-existence of output of the first frequency and existence or non-existence of output of the second frequency in time series in a case where electric power is supplied by the superimposing method.

The circuit configuration using the superimposing method shown in FIG. 4 is on the premise on a case of alternately outputting a signal output by switching on and off the direct current at the first frequency by the inverter 21b and a signal output by switching on and off the direct current at the second frequency by the inverter 26b, as shown in FIG. 21.

First, each measuring section 103 shown in FIG. 4 receives input of detection signals from the current sensor 101 and the voltage sensor 102, and measures the DC current and the DC voltage at each of sampling times.

Next, when the inverter 21b switches on or off the direct current at the first frequency, the processing unit 104 receives the currents and the voltages sampled by the current and voltage measuring unit 103a. The processing unit 104 integrates the products of the input values, that is, the current and voltage values of the individual sampling times, and divides the integrated value by the output time, thereby obtaining the average output power of the first frequency. Also, when the inverter 26b switches on and off the direct current at the second frequency, the processing unit 104 receives the currents and the voltages sampled by the current and voltage measuring unit 103a. The processing unit 104 integrates the products of the input values, that is, the current and voltage values of the individual sampling times, and divides the integrated value by the output time, thereby obtaining the average output power of the second frequency.

Next, the processing unit 104 may display the supplied electric power on a display unit (not shown) on the basis of the magnitudes of the average output power of the first frequency and the average output power of the second frequency, thereby making a superintendent monitor the supplied electric power.

As described above, in the embodiment of the present invention, the measuring sections 103 measure the DC voltages and the DC currents which are output from the converters 21a and 26a to the inverters 21b and 26b in the first power source 21 and the second power source 26 forming the power source system 20, at each sampling time. Therefore, it is possible to monitor electric power which is output from the first power source 21 and the second power source 26, and the like.

Monitoring of Power Supply to One Induction Heating Apparatus

Until now, the case where one of the induction heating apparatuses 10 is connected to the power source system 20 through the switching section 30 and electric power is supplied from the power source system 20 to the corresponding induction heating apparatus 10 has been mainly described. However, even in a case where there is only one induction heating apparatus 10 and electric power is supplied to the induction heating apparatus 10, output monitoring can be similarly performed.

That is, assuming that the induction heating system 1 of FIG. 1 has only the induction heating apparatus 10A, output monitoring is performed as follows. The induction heating system 1 has at least one of the first power source 21 and the second power source 26, as at least one power supply apparatus 120. As shown in FIGS. 3 and 4, the first power source 21 includes the converter 21a configured to convert an alternate current into a direct current, and an inverter 21b for converting the direct current input from the converter 21a by switching on and off the direct current at an optional frequency, and outputting the converted signal. As shown in FIG. 4, the second power source 26 includes the converter 26a configured to convert an alternate current into a direct current, and an inverter 26b configured to convert the direct current input from the converter 26a by switching on and off the direct current at an optional frequency, and outputting the converted signal. The power supply apparatus 120 is connected to supply electric power to a single heating coil 13 as shown in FIGS. 3 and 4. If there is a plurality of heat treatment areas in one workpiece, a plurality of coils may be connected in series or in parallel. Even in this case, the term "single heating coil 13" is used as the collective name of the plurality of coils. One heating coil corresponds to one workpiece, and the one heating coil is called a single heating coil.

This induction heating system 1 is equipped with output monitoring apparatuses 110 each of which includes the measuring section 103 and the processing unit 104 shown in FIG. 20. The measuring sections 103 measure the DC voltages and the DC currents which are output from the converters 21a and 26a to the inverters 21b and 26b, at each sampling time. Each measuring section 103 includes the current and voltage measuring unit 103a and the frequency measuring unit 103b as described with reference to FIG. 20. Each processing unit 104 obtains an amount of electric power of a corresponding frequency, from the values of the currents and the voltages of the individual sampling times measured by the measuring section 103, and obtains average electric power of the corresponding frequency on the basis of the amount of electric power of the corresponding frequency.

When this induction heating system 1 is used to switching on or off at least on direct current at at least one frequency, thereby performing induction heating, the currents and the voltages where are output from the converters 21a and 26a to the inverters 21b and 26b in the first power source 21 and the second power source 26 are measured at each sampling time, and the products of the currents and the voltages measured at the sampling times are integrated with respect to each frequency, whereby the average electric power of each frequency is obtained. As a result, it is possible to monitor the output situation of the power supply apparatus 120 on the basis of the average electric power of each frequency.

In a case where the power supply apparatus 120 supplies electric power by the time-division method, output monitoring is performed as follows. As the power supply apparatus 120, the first power source 21 is provided as shown in FIG. 3. In a case where the inverter 21b of the first power source 21 adjusts the output power of the high frequency and the output power of the low frequency at the ratios of the high frequency output time and the low frequency output time with respect to the output period, specifically, in a case where the inverter 21b of the first power source 21 alternatively outputs the low frequency and the high frequency, the processing unit 104 calculates the products of the DC currents and the DC voltages of the individual sampling times measured on the basis of the input values from the current sensor 101 and the voltage sensor 102 by the measuring section 103, thereby obtaining the average electric power of the high frequency and the average electric power of the low frequency supplied from the first power source 21 serving as one power supply apparatus 120 to the heating coil 13.

That is, when one direct current is switched on or off differently at the high frequency (the first frequency) and at the low frequency (the second frequency) by the DT signal, and the high frequency and the low frequency are output by time-division multiplexing for performing induction heating, the current and voltage of the one direct current is measured at each sampling time. The products of the currents and the voltages of the individual sampling times measured during the switching at the first frequency are integrated, whereby the average electric power of the first frequency is obtained. Similarly, the products of the currents and the voltages of the individual sampling times measured during the switching at the second frequency are integrated, whereby the average electric power of the second frequency is obtained. On the basis of the average electric power of the first frequency and the average electric power of the second frequency, it is possible to monitoring output power.

In a case where the power supply apparatus 120 supplies electric power by the superimposing method, output monitoring is performed as follows. As shown in FIG. 4, the power supply apparatus 120 includes the first power source 21 serving as a first power supply apparatus, and the second power source 26 serving as a second power supply apparatus. In this case, in the first power source 21, the inverter 21b converts the direct current input from the converter 21a by switching on and off the direct current at the first frequency, and outputs the converted signal. Simultaneously with this, in the second power source 26, the inverter 26b converts the direct current input from the converter 26a by switching on and off the direct current at the second frequency, and outputs the converted signal. The first frequency and the second frequency from the two power sources of the first power source 21 and the second power source 26 are superimposed and supplied to the heating coil 13.

In this case, as shown in FIG. 4, the measuring section 103 includes a first measuring unit 103c that is provided for the first power source 21, and a second measuring unit 103d that is provided for the second power source 26. The first measuring unit 103c measures the DC current and the DC voltage output from the converter 21a to the inverter 21b in the first power source 21, at each sampling time. The second measuring unit 103d measures the DC current and the DC voltage output from the converter 26a to the inverter 26b in the second power source 26, at each sampling time.

Accordingly, the processing unit 104 obtains the amount of electric power of the first frequency from the values of the currents and the voltages of the individual sampling times measured by the first measuring unit 103c, obtains the amount of electric power of the second frequency from the values of the current and the voltage of the individual sampling times measured by the second measuring unit 103d, and obtains the average electric power of the first frequency and the average electric power of the second frequency on the basis of the amount of electric power of the first frequency and the amount of electric power of the second frequency.

In other words, in a case where the first power source 21 converts a first direct current by switching on and off the first direct current at the first frequency and outputs the converted signal while the second power source 26 converts a second direct current by switching on and off the second direct current at the second frequency, and the first frequency and the second frequency are superimposed to perform induction heating, the first measuring unit 103c measures the current and voltage of the first direct current at each sampling time, and the second measuring unit 103d measures the current and voltage of the second direct current at each sampling time. Then, the processing unit 104 integrates the products of the currents and voltages of the individual sampling times relative to the first direct current and measured during the switching at the first frequency, and divides the integrated value by the induction heating time, thereby obtaining the average electric power of the first frequency. Similarly, the processing unit 104 integrates the products of the currents and voltages of the individual sampling times relative to the second direct current and measured during the switching at the second frequency, and divides the integrated value by the induction heating time, thereby obtaining the average electric power of the second frequency. On the basis of the average electric power of the first frequency and the average electric power of the second frequency, the processing unit 104 monitors the output power.

The case where the induction heating system 1 includes a plurality of induction heating apparatuses as shown in FIG. 1 has been already described, and thus is described here.

As described above, in the induction heating system 1, the supplied electric power is monitored by the output monitoring apparatus 110. Therefore, it is possible to monitor an anomaly of a load, an anomaly of a bus bar, and the like.

Other Monitoring

Since the induction heating system 1 shown in FIG. 1 includes the output monitoring apparatus 110, it is possible to monitor electric power supplied to each induction heating apparatus 10. The output monitoring apparatus 110 can also be used to monitor an actual output frequency and the DC voltage Vdc during heating for a very short time.

For example, in the output monitoring apparatus 110, the current and voltage measuring unit 103a can measure the DC voltage Vdc input to the inverter 21b or 26b at each sampling time, thereby always monitoring the DC voltage Vdc. In this case, it is possible to obtain the average value of a plurality of data items every sampling time, for example, 4 ms to 6 ms in disregard of several milliseconds immediately after switching to a frequency, and integrate the average values of the individual sampling times until termination of the corresponding frequency, and dividing the integrated value by the number of sampling times, thereby monitoring the average DC voltage.

For example, in the output monitoring apparatus 110, the frequency measuring unit 103b can monitor the number of times of switching per unit time by the inverter 21b or 26b, thereby measuring the frequency. Therefore, while electric power of each frequency is being output, it is possible to monitor the output frequency.

For example, even in heating for a very short time, it is possible to measure the DC voltage Vdc and the frequency, thereby monitoring them.

Like this, even when electric power is being supplied, it is possible to always monitor the DC voltage and the frequency as control objects, and it is possible to provide a guidance representing whether induction heating is being appropriately performed.

While the present invention has been described in connection with certain embodiments thereof, those skilled in the art will understand that various changes and modifications may be made within the scope of the invention as defined by the appended claims.

INDUSTRIAL APPLICABILITY

One or more embodiments of the invention provide an induction heating system and an induction heating method for supplying electric power with different frequencies to a plurality of induction heating apparatuses, an output monitoring apparatus and an output monitoring method for monitoring an output situation when electric power is supplied from a power supply apparatus to a heating coil to perform induction heating, and an induction heating apparatus having a low-frequency current transformer and a high-frequency current transformer.

This application is based on Japanese Patent Application Nos. 2012-115121, 2012-115122 and 2012-115123, filed on May 18, 2012, the entire contents of which are incorporated herein by reference.

The invention claimed is:

1. An induction heating system comprising:
a plurality of induction heating apparatuses, each of the induction heating apparatuses including a high-frequency current transformer, a low-frequency current transformer, and a heating coil to which a secondary side of the high-frequency current transformer and a secondary side of the low-frequency current transformer are connected in parallel;
a high-frequency input switch connected to a primary side of the high-frequency current transformer of each induction heating apparatus;
a low-frequency input switch connected to a primary side of the low-frequency current transformer of each induction heating apparatus;
a first power source including a high frequency output terminal arranged to be connected to the primary side of the high-frequency current transformer of each induction heating apparatus and a low frequency output terminal arranged to be connected to the primary side of the low-frequency current transformer of each induction heating apparatus,
the first power source including a first power source controller configured to adjust a ratio of a high frequency output time for outputting high frequency electric power and a low frequency output time for outputting low frequency electric power from the first power source during a time period, and to control output of the high frequency electric power and the low frequency electric power from the first power source to each induction heating apparatus according to the adjusted ratio;
a second power source including an output terminal arranged to be connected to the low-frequency current transformers of each induction heating apparatus and including a second power source controller configured to control output of a frequency value of electric power from the second power source to each induction heating apparatus that is different from a frequency value of the electric power output from the first power source to each induction heating apparatus;
a first power source output switch arranged to be connectable to the low-frequency output terminal of the first power source;
a second power source output switch arranged to be connectable to the output terminal of the second power source; and
a switch controller configured to control the high-frequency input switch and the low-frequency input switch for each of the induction heating apparatuses, and to control the first power source output switch and the second power source output switch so as to connect at least one of the induction heating apparatuses to at least one of the first power source and the second power source,
wherein each of the induction heating apparatuses includes a heater controller configured to send a switching request signal for requesting receipt of a source of power for initiating an induction heating operation to the switch controller, the switch controller performing control operations for providing the source of power based on the received switching request signal that includes: to turn on one of the first power source output switch for the first power source and the second power source output switch for the second power source, and to switch on or off each of the high-frequency input switch and the low-frequency input switch to respective induction heating apparatuses.

2. The induction heating system according to claim 1, wherein, upon receipt of the switching request signal, the switch controller controls the first power source output switch and the second power source output switch and also the high-frequency input switch and the low-frequency input switch that are connected to one of the induction heating apparatuses from which the switching request signal is sent,
the switch controller sends a switching completion signal to the heater controller of the one induction heating apparatus when the switch controller has completed the control in accordance with the switching request signal, and
upon receipt of the switching completion signal by the heater controller of the one induction heating apparatus, the heating controller of the one the induction heating apparatus controls the receipt of power from the first power source and the second power source.

3. The induction heating system according to claim 1, wherein the low-frequency current transformer includes a core coupling the primary winding and the secondary winding of the low-frequency current transformer,
wherein the low-frequency current transformer is arranged below the high-frequency current transformer, and
wherein each of the induction heating apparatuses is configured such that another heating coil having a different impedance that is attachable, and such that another low-frequency current transformer having a different number of turns of primary and secondary windings that satisfies an impedance matching condition corresponding to the heating coil having the different impedance is attachable.

4. The induction heating system according to claim 3, wherein each of the induction heating apparatuses further comprises:
a mounting frame supporting the low-frequency current transformer and the high-frequency current transformer; and
a replacing mechanism provided on the mounting frame to replace the low-frequency current transformer,
wherein the replacing mechanism comprises a front-rear direction support extending in a front-rear direction of the mounting frame, and a carriage on which the low-frequency current transformer is mounted and moves on the front-rear direction support in the front-rear direction,
wherein, when the carriage is moved forward with respect to the front-rear direction, the low-frequency current transformer is arranged at a position at which the secondary side of the low-frequency current transformer is connectable to the heating coil, and
wherein, when the carriage is moved backward with respect the front-rear direction, the low-frequency current transformer is arranged at a position at which the low-frequency current transformer does not overlap the high-frequency current transformer in a vertical direction on the mounting frame.

* * * * *